(12) United States Patent
Ogawa et al.

(10) Patent No.: US 11,183,479 B2
(45) Date of Patent: Nov. 23, 2021

(54) SEMICONDUCTOR DEVICE, METHOD FOR MANUFACTURING THE SAME, AND POWER CONVERSION DEVICE

(71) Applicant: Mitsubishi Electric Corporation, Tokyo (JP)

(72) Inventors: Shohei Ogawa, Tokyo (JP); Junji Fujino, Tokyo (JP); Isao Oshima, Tokyo (JP); Satoru Ishikawa, Tokyo (JP); Takumi Shigemoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 10 days.

(21) Appl. No.: 16/485,909

(22) PCT Filed: Mar. 29, 2018

(86) PCT No.: PCT/JP2018/013282
§ 371 (c)(1),
(2) Date: Aug. 14, 2019

(87) PCT Pub. No.: WO2018/181727
PCT Pub. Date: Oct. 4, 2018

(65) Prior Publication Data
US 2020/0043887 A1    Feb. 6, 2020

(30) Foreign Application Priority Data
Mar. 30, 2017 (JP) .............................. JP2017-067506

(51) Int. Cl.
*H01L 23/00* (2006.01)
*H01L 23/053* (2006.01)
(Continued)

(52) U.S. Cl.
CPC ............. *H01L 24/83* (2013.01); *H01L 23/053* (2013.01); *H01L 24/29* (2013.01); *H01L 24/32* (2013.01);
(Continued)

(58) Field of Classification Search
CPC ......... H01L 24/29; H01L 24/32; H01L 24/33; H01L 24/73; H01L 24/81–83;
(Continued)

(56) References Cited

U.S. PATENT DOCUMENTS 6,197,618 B1    3/2001 Guillot et al.
2005/0093115 A1    5/2005 Eytcheson
(Continued)

FOREIGN PATENT DOCUMENTS

DE         60132044 T2    12/2008
DE    102008055134 A1     7/2010
(Continued)

OTHER PUBLICATIONS

International Search Report (PCT/ISA/210) dated Jun. 19, 2018, by the Japan Patent Office as the International Searching Authority for International Application No. PCT/JP2018/013282.
(Continued)

*Primary Examiner* — Nguyen Tran
(74) *Attorney, Agent, or Firm* — Buchanan Ingersoll & Rooney PC

(57) ABSTRACT

In a method for manufacturing a semiconductor device, a plurality of first provisional fixing portions are supplied on a front surface of a substrate such that the plurality of first provisional fixing portions are spaced from each other and thus dispersed. A first solder layer processed into a plate to be a first soldering portion is disposed in contact with the plurality of first provisional fixing portions. A semiconductor chip is disposed on the first solder layer. In addition a
(Continued)

conductive member in the form of a flat plate is disposed thereon via a second provisional fixing portion and a second solder layer. A reflow process is performed to solder the substrate, the semiconductor chip and the conductive member together.

16 Claims, 13 Drawing Sheets

(51) Int. Cl.
*H02M 7/5387* (2007.01)
*H02P 27/08* (2006.01)

(52) U.S. Cl.
CPC .............. *H01L 24/33* (2013.01); *H01L 24/73* (2013.01); *H02M 7/53871* (2013.01); *H01L 2224/26145* (2013.01); *H01L 2224/26175* (2013.01); *H01L 2224/29139* (2013.01); *H01L 2224/32225* (2013.01); *H01L 2224/32245* (2013.01); *H01L 2224/33179* (2013.01); *H01L 2224/33181* (2013.01); *H01L 2224/33505* (2013.01); *H01L 2224/73215* (2013.01); *H01L 2224/73265* (2013.01); *H01L 2224/83007* (2013.01); *H01L 2224/8384* (2013.01); *H01L 2224/83193* (2013.01); *H01L 2224/83815* (2013.01); *H01L 2224/83905* (2013.01); *H02P 27/08* (2013.01)

(58) Field of Classification Search
CPC ......... H01L 23/053; H01L 2224/26145; H01L 2224/26175; H01L 2224/29139; H01L 2224/32225; H01L 2224/32245; H01L 2224/33179; H01L 2224/33181; H01L 2224/335505; H01L 2224/73215; H01L 2224/73265; H01L 2224/83007; H01L 2224/83193; H01L 2224/83815; H01L 2224/8384; H01L 2224/83905; H02M 7/53871; H02P 27/08
See application file for complete search history.

(56) References Cited

U.S. PATENT DOCUMENTS

| | | | | |
|---|---|---|---|---|
| 2006/0073637 | A1* | 4/2006 | Yokoyama | H01L 23/481 438/109 |
| 2006/0084254 | A1* | 4/2006 | Attarwala | H01L 24/75 438/584 |
| 2008/0202661 | A1* | 8/2008 | Kobayashi | H05K 3/0097 156/50 |
| 2008/0247703 | A1* | 10/2008 | Kodama | G02B 6/43 385/14 |
| 2009/0194322 | A1* | 8/2009 | Usui | H05K 1/115 174/260 |
| 2009/0250248 | A1* | 10/2009 | Kan | H05K 1/053 174/252 |
| 2011/0038122 | A1* | 2/2011 | Ahangar | H01L 23/4275 361/700 |
| 2011/0304985 | A1 | 12/2011 | Rittner et al. | |
| 2012/0094442 | A1* | 4/2012 | Lin | H05K 1/021 438/118 |
| 2013/0130439 | A1* | 5/2013 | Hopper | H01L 24/24 438/106 |
| 2014/0374902 | A1* | 12/2014 | Lee | H01L 25/105 257/738 |
| 2015/0077991 | A1* | 3/2015 | Palfreyman | F21S 2/00 362/235 |
| 2015/0091149 | A1* | 4/2015 | Jang | H01L 23/49811 257/686 |
| 2015/0294948 | A1* | 10/2015 | Ayotte | H01L 24/81 257/737 |
| 2017/0053960 | A1* | 2/2017 | Wakiyama | H01L 27/1469 |
| 2017/0154834 | A1* | 6/2017 | Tonedachi | H01L 23/49844 |
| 2017/0213777 | A1* | 7/2017 | Soyano | H01L 23/49866 |
| 2017/0290521 | A1* | 10/2017 | Angle | A61B 5/04001 |
| 2018/0033771 | A1* | 2/2018 | Yu | H01L 25/0652 |
| 2018/0202470 | A1* | 7/2018 | Hoh | G05D 16/2024 |
| 2019/0193210 | A1* | 6/2019 | Watanabe | H01L 24/48 |

FOREIGN PATENT DOCUMENTS

| | | |
|---|---|---|
| JP | H04120741 A | 4/1992 |
| JP | H11186331 A | 7/1999 |
| JP | 2001267368 A | 9/2001 |
| JP | 2003218508 A | 7/2003 |
| JP | 2003273165 A | 9/2003 |
| JP | 2014043382 A | 3/2014 |

OTHER PUBLICATIONS

Written Opinion (PCT/ISA/237) dated Jun. 19, 2018, by the Japan Patent Office as the International Searching Authority for International Application No. PCT/JP2018/013282.

* cited by examiner

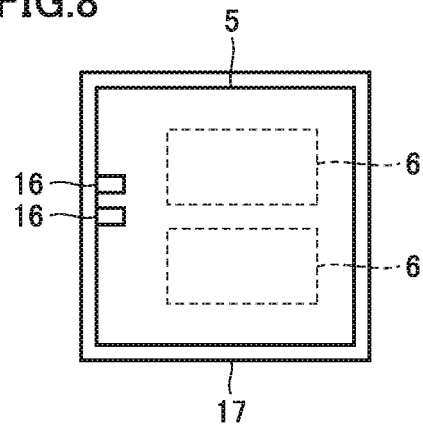
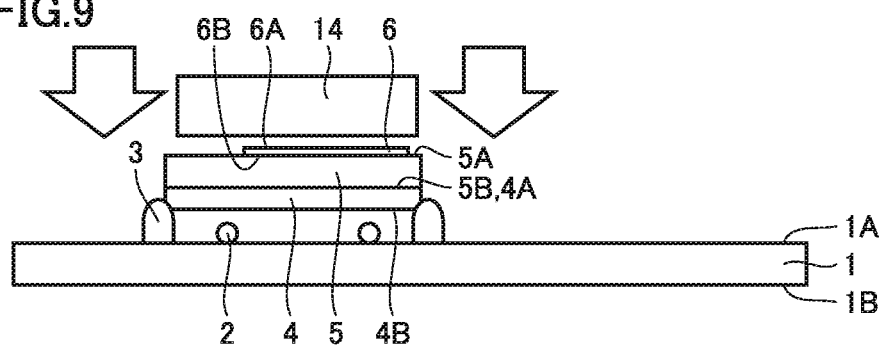
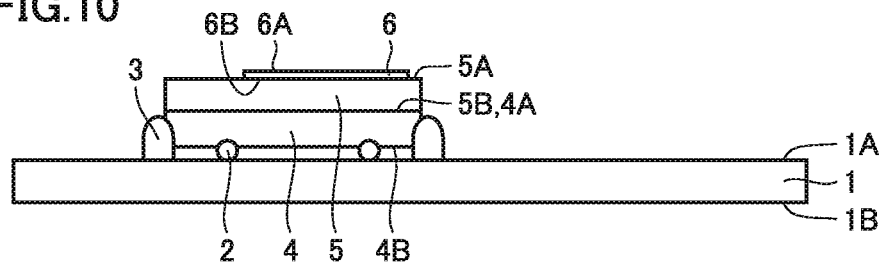

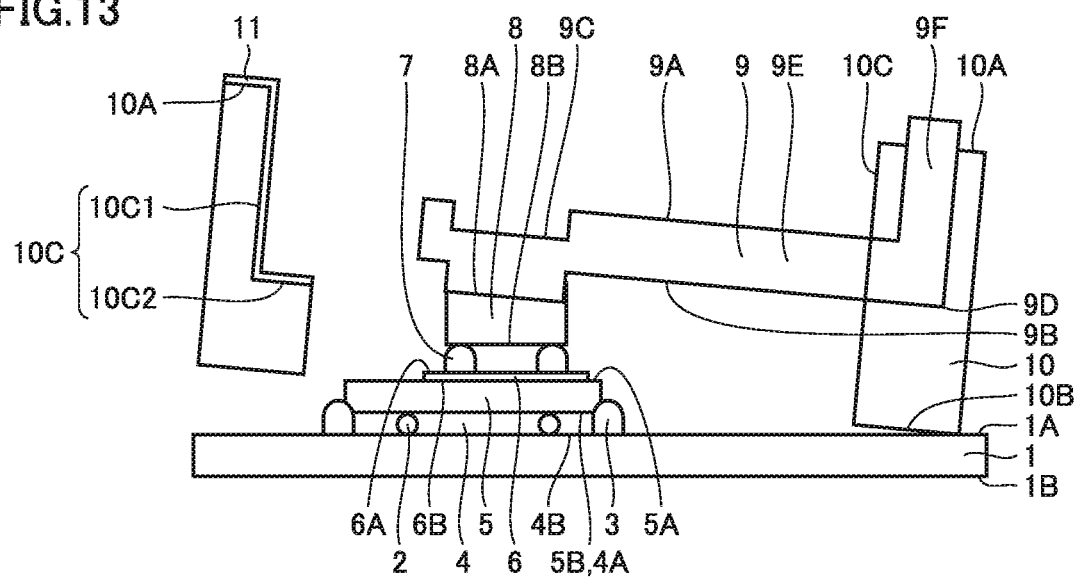
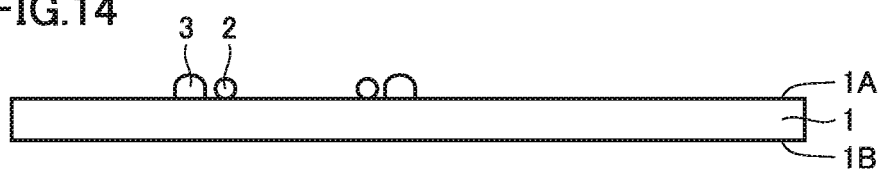
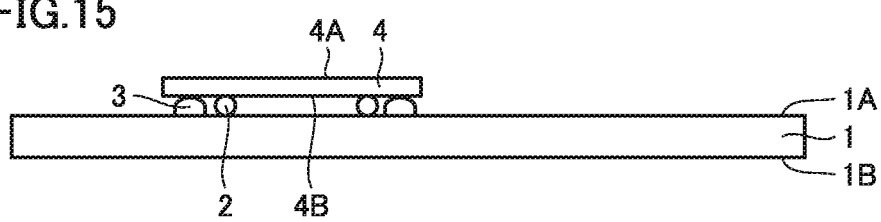

SEMICONDUCTOR DEVICE, METHOD FOR MANUFACTURING THE SAME, AND POWER CONVERSION DEVICE

TECHNICAL FIELD

The present invention relates to a semiconductor device, a method for manufacturing the same, and a power conversion device, and more specifically to a power module having a structure in which a conductive member in the form of a flat plate is soldered on a semiconductor chip, a method for manufacturing the same, and a power conversion device to which the semiconductor device is applied.

BACKGROUND ART

In a power module, energy density can be increased by changing a wiring above a semiconductor chip from a bonding wire to a conductive member in the form of a flat plate. This is because the conductive member in the form of a flat plate has a larger area in a cross section transverse to a path for a current than the bonding wire, and can thus pass the current therethrough in a significantly increased amount. As an example of such a power module, for example, Japanese Patent Laying-Open No. 2014-043382 (Patent Literature 1) discloses a configuration in which a substrate and a semiconductor chip are bonded together and the semiconductor chip has an upper surface with a conductive member in the form of a flat plate bonded thereto.

When forming the structure of Japanese Patent Laying-Open No. 2014-043382, from the viewpoint of suppressing positional displacement between members bonded together, it is necessary to bond the semiconductor chip to the underlying substrate by a reflow process and subsequently introduce the semiconductor chip and an overlying conductive member in the form of a flat plate into a reflow process again to bond them together.

As has been set forth above, a power module has a possibility of positional displacement between members bonded together. Accordingly, for example, Japanese Patent Laying-Open Nos. 2003-218508 (Patent Literature 2) and 2003-273165 (Patent Literature 3) disclose the following idea: That is, an adhesive before it cures is applied to the entirety of a location which overlaps in a plan view a location where an electronic component such as a semiconductor chip is mounted or the overlapping location's perimeter, and subsequently the adhesive is cured by soldering in a reflow process. Positional displacement is thereby suppressed between members constituting the semiconductor device while handling or transporting the semiconductor device.

CITATION LIST

Patent Literature

PTL 1: Japanese Patent Laying-Open No. 2014-043382
PTL 2: Japanese Patent Laying-Open No. 2003-218508
PTL 3: Japanese Patent Laying-Open No. 2003-273165

SUMMARY OF INVENTION

Technical Problem

In Japanese Patent Laying-Open No. 2014-043382, attempting to complete bonding a lower surface of the semiconductor chip to the substrate and bonding the upper surface of the semiconductor chip to the conductive member in the form of a flat plate at one time causes positional displacement of the semiconductor chip. This is because Japanese Patent Laying-Open No. 2014-043382 does not describe a concept of provisionally fixing the semiconductor chip. In Japanese Patent Laying-Open No. 2014-043382, for example, supplying pasty solder to the entirety of a location which overlaps the semiconductor chip in a plan view or the overlapping location's perimeter, and subsequently, utilizing its viscosity to provisionally fix the semiconductor chip to suppress positional displacement of the semiconductor chip, is also considered. However, pasty solder contains a volatile component, and when the pasty solder is used in a wide area such as the entirety of the area overlapping the semiconductor chip or the area's perimeter, in particular, the pasty solder easily causes voids in the area/perimeter and may thus invite reduced heat radiation therein.

In contrast, Japanese Patent Laying-Open Nos. 2003-218508 and 2003-273165 indicate provisionally fixing a semiconductor chip by applying an adhesive before it cures, as described above. However, when the adhesive is disposed on the entirety of a location which overlaps in a plan view a location where the semiconductor chip is mounted or the overlapping location's perimeter, and the semiconductor chip, which has a large-area and used in a power module, is soldered, there can be no path ensured to allow gas trapped between the solder and the substrate or between the semiconductor chip and the solder to escape. For this reason, voids may be formed in the soldering portion, and may invite reduced heat radiation in that portion.

The present invention has been made in view of the above issue, and an object thereof is to provide a semiconductor device manufacturing method that can suppress through a simple process both positional displacement of a semiconductor chip and formation of voids in a soldering portion, a semiconductor device manufactured in the method, and a power conversion device to which the semiconductor device is applied.

Solution to Problem

A method for manufacturing a semiconductor device according to the present invention comprises the following steps. A plurality of first provisional fixing portions are supplied on a front surface of a substrate such that the plurality of first provisional fixing portions are spaced from each other and thus dispersed. A first solder layer processed into a plate to be a first soldering portion is disposed in contact with the plurality of first provisional fixing portions. A semiconductor chip is disposed on the first solder layer. A plurality of second provisional fixing portions are supplied on a front surface of the semiconductor chip such that the plurality of second provisional fixing portions are spaced from each other and thus dispersed. A second solder layer processed into a plate to be a second soldering portion is disposed in contact with the plurality of second provisional fixing portions. A conductive member in a form of a flat plate is disposed on the second solder layer. The substrate, the semiconductor chip and the conductive member are heated so that the substrate and the semiconductor chip are bonded by the first solder layer and the semiconductor chip and the conductive member are bonded by the second solder layer.

A semiconductor device of the present invention comprises a substrate, a semiconductor chip, and a conductive member in the form of a flat plate. The semiconductor chip is disposed on the substrate. The conductive member is disposed on the semiconductor chip. The substrate and the semiconductor chip are bonded together by a first soldering portion. The semiconductor chip and the conductive member are bonded together by a second soldering portion. The semiconductor device further comprises a plurality of first regions disposed in the same layer as the first soldering portion such that the plurality of first regions are spaced from each other, and having a composition different than the first soldering portion. The semiconductor device further comprises a plurality of second regions disposed in the same layer as the second soldering portion such that the plurality of second regions are spaced from each other, and having a composition different than the second soldering portion.

Advantageous Effects of Invention

The method of the present invention allows dispersed first and second provisional fixing portions' viscosity to be utilized to provisionally fix a solder layer and a semiconductor chip so that a bonding process can be completed without positional displacement through a reflow process performed only once. Further, the semiconductor device of the present invention has first and second regions only dispersed and thus disposed in a small range so that an effect of voids formed therein to reduce heat radiation can be suppressed.

BRIEF DESCRIPTION OF DRAWINGS

FIG. 8 is a schematic plan view showing a pad and a guard ring provided in the semiconductor chips shown in FIG. 6(B) and FIG. 7(B).

FIG. 9 is a schematic side view showing a first step of a method for manufacturing a power module in a second embodiment of the present invention.

FIG. 10 is a schematic side view showing a second step of the method for manufacturing a power module in the second embodiment of the present invention.

FIG. 13 is a schematic side view showing a second example of a defect in a comparative example.

FIG. 14 is a schematic side view showing a first step of a method for manufacturing a power module in a third embodiment of the present invention.

FIG. 15 is a schematic side view showing a second step of the method for manufacturing a power module in the third embodiment of the present invention.

DESCRIPTION OF EMBODIMENTS

Hereinafter reference will be made to the drawings to describe the present invention in embodiments.

First Embodiment

Figure 1:
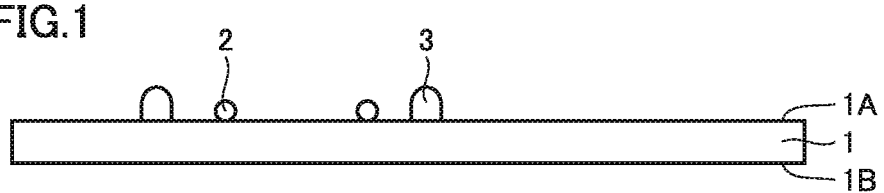
FIG. 1 is a schematic side view showing a first step of a method for manufacturing a power module in a first embodiment of the present invention.

Initially, a method for manufacturing a power module as a semiconductor device according to a first example of the present embodiment will be described with reference to FIGS. 1 to 5. Referring to FIG. 1, in the method for manufacturing a power module according to the first example of the present embodiment, initially, an insulating substrate 1 is prepared as a substrate. While insulating substrate 1 has, for example, a rectangular shape in a plan view, it is not limited thereto and may have a different planar shape such as a circle or an oval. Insulating substrate 1 has a front surface 1A and an opposite, back surface 1B facing away therefrom. Herein, as an example, insulating substrate 1 has a square shape with a size of 100 mm×100 mm in a plan view for the sake of illustration. In addition, although not shown, insulating substrate 1 is constructed for example by an aluminum layer having a thickness of 0.3 mm, an aluminum nitride layer having a thickness of 0.6 mm, an aluminum layer having a thickness of 0.3 mm, and a nickel plating layer having a thickness for example of 5 μm to 10 μm deposited in the stated order from back surface 1B toward front surface 1A for the sake of illustration.

Note that herein the front surface of each member means a major surface thereof facing upward in each schematic side view, and the back surface of each member means a major surface thereof facing away from the front surface in each schematic side view, that is, facing downward.

On front surface 1A of insulating substrate 1, a wire bump 2 having a substantially circular cross section with a diameter for example of about 100 μm is disposed in advance. Wire bump 2 is a linear member, and is disposed to extend in a direction along front surface 1A. Wire bump 2 is a wire of aluminum for example. Preferably wire bumps 2 are disposed on front surface 1A at a plurality of locations, for example at four locations, i.e., at four corners of front surface 1A, such that they are each spaced from another in a direction which intersects that in which the wire bump extends. Four wire bumps 2 are disposed on front surface 1A of insulating substrate 1 such that wire bumps 2 have therebetween a distance smaller than the length of one side or a maximum dimension in a plan view of the semiconductor chip to be mounted later.

Subsequently, on front surface 1A of insulating substrate 1, a plurality of first provisional fixing portions 3 are supplied such that they are spaced from each other and thus dispersed. Preferably, first provisional fixing portions 3 are supplied so as to be able to surround for example two wire bumps 2 outside in a plan view in a direction in which two wire bumps 2 are aligned. Preferably, first provisional fixing portions 3 that are provided at four locations are supplied so as to be in a positional relationship forming a rectangle or a square when they are connected together. In addition, herein, preferably, first provisional fixing portions 3 are supplied such that when they are connected together they can form a rectangle or a square having a size equal in a plan view to a first solder layer and a semiconductor chip to be mounted later. That is, first provisional fixing portion 3 has some width in a direction along front surface 1A, and when first provisional fixing portions 3 are connected together they will form a rectangle having a size having some range, and preferably the size equal in a plan view to the first solder layer and the semiconductor chip is included in that range.

First provisional fixing portion 3 is, for example, a silver-containing, one-component, thermosetting and conductive, pasty member, and preferably it is applied to front surface 1A through a dispenser. In the present embodiment, first provisional fixing portion 3 preferably includes a material set at a temperature lower than solder's melting point in a reflow process described hereinafter.

First provisional fixing portion 3 includes a material that volatilizes when it is heated at a temperature lower than the melting point of the solder in the reflow process. While the volatile material may be, for example, a solvent component such as water or ethanol, it may be a material having reducibility such as flux. Furthermore, first provisional fixing portion 3 may include a sinterable metal material that is sintered at a temperature lower than the melting point of the solder in the reflow process. Specifically, first provisional fixing portion 3 may be, for example, a sinterable material containing silver.

As has been described above, in the present embodiment, first provisional fixing portion 3 is a pasty member. In other words, first provisional fixing portion 3 of the present embodiment is preferably an adhesive having viscosity in a temperature range from room temperature (for example of 15° C.) to a melting point at which the solder melts.

Figure 2:
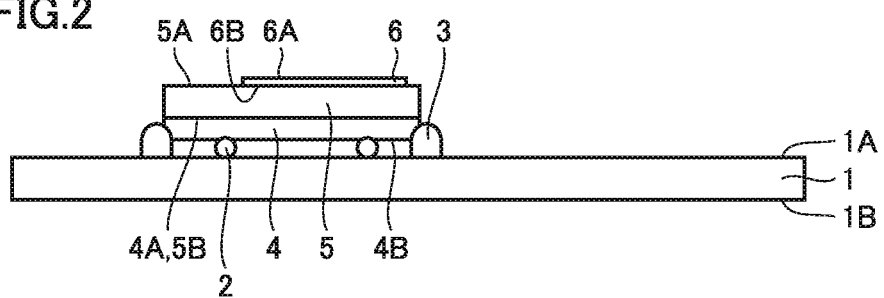
FIG. 2 is a schematic side view showing a second step of the method for manufacturing a power module in the first embodiment of the present invention.

Referring to FIG. 2, subsequently, a first solder layer 4 to be a first soldering portion is disposed in contact with the plurality of first provisional fixing portions 3. First solder layer 4 is previously processed into a plate having a front surface 4A and an opposite, back surface 4B facing away therefrom. Herein, as an example, first solder layer 4 in the form of a square having a size of 15 mm×15 mm in a plan view and a thickness of 0.15 mm is disposed. First solder layer 4 is preferably made of an alloy of tin and copper. As has been described above, the plurality of (for example, four) first provisional fixing portions 3 are supplied so as to be equal to first solder layer 4 in size in a plan view when first provisional fixing portions 3 are connected together. Thus, first solder layer 4 can be disposed on first provisional fixing portions 3 so as to have its lower major surface or back surface 4B with four corners (i.e., regions adjacent to its apexes) each in contact with one of four first provisional fixing portions 3. Further, as shown in FIG. 2, in particular, it is preferable that first provisional fixing portion 3 have at least a portion in a region outside an end face of first solder layer 4. That is, first provisional fixing portion 3 of the present embodiment has a role as an adhesive for provisionally fixing first solder layer 4 thereon.

Subsequently, a semiconductor chip 5 is disposed on first solder layer 4. Semiconductor chip 5 is a flat plate made of, for example, a single crystal of silicon and having a size of 15 mm×15 mm in a plan view and a thickness of 100 μm. That is, semiconductor chip 5 is in the form of a flat plate having a front surface 5A and an opposite, back surface 5B facing away therefrom. Accordingly, semiconductor chip 5 is mounted on first solder layer 4 such that back surface 5B and front surface 4A are in contact with each other. For example, an IGBT (Insulated Gate Bipolar Transistor) is mounted in semiconductor chip 5, although semiconductor chip 5 is not limited as such. When first solder layer 4 and semiconductor chip 5 in a plan view are equal in size, as described above, first provisional fixing portion 3 has at least a portion (of its surface) in a region outside an end face of semiconductor chip 5, as shown in FIG. 2. Note that at this point in time, semiconductor chip 5 may not have an end face in contact with first provisional fixing portion 3, as shown in FIG. 2, or may have the end face in contact with first provisional fixing portion 3.

A top electrode 6 is formed on a portion of front surface 5A of semiconductor chip 5. While top electrode 6 has, for example, the shape of a rectangular flat plate having a front surface 6A and an opposite, back surface 6B facing away therefrom, it is not limited thereto and may be, for example, circular or elliptical. Top electrode 6 is formed such that back surface 6B and front surface 5A are in contact with each other. Top electrode 6 is a portion of a component of semiconductor chip 5 and is, for example, a pad electrode electrically connected to each terminal of the IGBT. Top electrode 6 is made of, for example, a thin film of nickel having a thickness of 5 μm.

Figure 3:
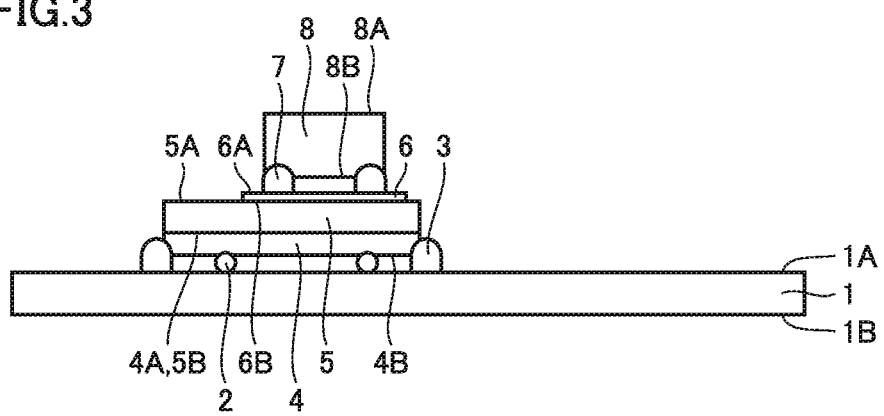
FIG. 3 is a schematic side view showing a third step of the method for manufacturing a power module in the first embodiment of the present invention.

Referring to FIG. 3, subsequently, on front surface 5A of semiconductor chip 5, herein on front surface 6A of top electrode 6, in particular, a plurality of second provisional fixing portions 7 are supplied such that they are mutually spaced and thus dispersed. Herein, for example when top electrode 6 has a rectangular planar shape, second provisional fixing portion 7 is disposed such that four second provisional fixing portions 7 come into contact with four corners of front surface 6A and have a positional relationship allowing a rectangle or a square to be formed when the four second provisional fixing portions 7 are connected together. In addition, herein, preferably, second provisional fixing portions 7 are supplied such that when they are connected together they can form a rectangle or a square having a size substantially equal to that in a plan view of a second solder layer to be mounted later.

Second provisional fixing portion 7 is, for example, a silver-containing, one-component, thermosetting and conductive, pasty member, and preferably it is applied to front surface 6A through a dispenser. In the present embodiment, second provisional fixing portion 7 is preferably composed of a material set at a temperature lower than solder's melting point in the reflow process described hereinafter.

Second provisional fixing portion 7 includes a material that volatilizes when it is heated at a temperature lower than the melting point of the solder in the reflow process. While the volatile material may be, for example, a solvent component such as water or ethanol, it may be a material having reducibility such as flux. Furthermore, second provisional fixing portion 7 may include a sinterable metal material that is sintered at a temperature lower than the melting point of the solder in the reflow process. Specifically, second provisional fixing portion 7 may be, for example, a sinterable material containing silver.

As has been described above, in the present embodiment, second provisional fixing portion 7 is a pasty member. In other words, second provisional fixing portion 7 of the present embodiment is preferably an adhesive having viscosity in a temperature range from room temperature (for example of 15° C.) to a melting point at which the solder melts.

Referring to FIG. 3, subsequently, a second solder layer 8 to be a second soldering portion is disposed in contact with the plurality of second provisional fixing portions 7, that is, for example directly on front surface 6A. Second solder layer 8 is previously processed into a plate having a front surface 8A and an opposite, back surface 8B facing away therefrom. Herein, as an example, second solder layer 8 in the form of a rectangle having a size of 5 mm×7 mm in a plan view and a thickness of 0.4 mm is disposed. Second solder layer 8 is preferably made of an alloy of tin and copper. As has been described above, the plurality of (for example, four) second provisional fixing portions 7 are supplied so as to be equal to second solder layer 8 in size in a plan view when second provisional fixing portions 7 are connected together. Thus, second solder layer 8 can be disposed on second provisional fixing portions 7 so as to have its lower major surface or back surface 8B with four corners (i.e., regions adjacent to its apexes) each in contact with one of four second provisional fixing portions 7. That is, second provisional fixing portion 7 of the present embodiment has a role as an adhesive for provisionally fixing second solder layer 8 thereon.

Figure 4:
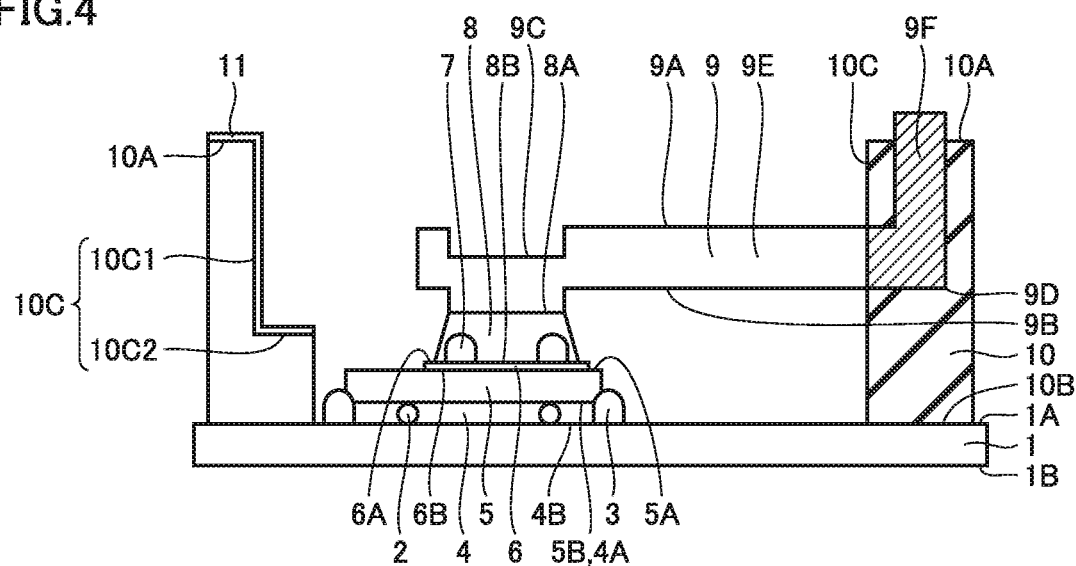
FIG. 4 is a schematic side view showing a fourth step of the method for manufacturing a power module in the first embodiment of the present invention.

Referring to FIG. 4, a conductive member 9 in the form of a flat plate made of copper, for example, is disposed on second solder layer 8. Conductive member 9 is a member in the form of a plate mainly having an elongate front surface 9A extending rightward and leftward in FIG. 4 and an opposite, back surface 9B facing away therefrom. Preferably, front surface 9A and back surface 9B have, for example, a rectangular planar shape extending rightward and leftward in the figure. However, front surface 9A and back surface 9B are not limited to such a planar shape, and may be, for example, an elliptical shape extending rightward and leftward in the figure or a rectangular planar shape with rounded corners.

Conductive member 9, in a region generally overlapping second solder layer 8 in a plane when conductive member 9 is bonded on second solder layer 8, has a recess 9C in which front surface 9A is partially recessed toward back surface 9B. When molding a case 10 of resin, conductive member 9 is partially inserted into a resin material used to form case 10, and is integrally formed with case 10 through an insert molding process. That is, conductive member 9 is configured to be partially embedded in case 10 through the insert molding process, for example. A portion of case 10 on the right side in FIG. 4 is shown in a cross-sectional view so that an interior of case 10 can be seen.

Conductive member 9 is bent at a bent portion 9D such that front surface 9A and back surface 9B are substantially orthogonal, for example. With bent portion 9D serving as a boundary, conductive member 9 has a horizontally extending portion 9E extending rightward and leftward in FIG. 4 through a space surrounded by the main body of case 10, and a vertically extending portion 9F embedded in case 10 and extending upward and downward in FIG. 4.

For instance when insulating substrate 1 has a rectangular shape in a plan view, case 10 is in the form of a rectangular frame that follows the shape of the outer peripheral portion of insulating substrate 1, for example. Case 10 in FIG. 4 has a top, front surface 10A and an opposite, back surface 10B facing away therefrom. Case 10 is disposed on and connected to insulating substrate 1 such that back surface 10B of case 10 is in contact with a region relatively close to an outer edge of front surface 1A of insulating substrate 1. As a result, a portion of back surface 9B of horizontally extending portion 9E of conductive member 9 is disposed in contact with front surface 8A of second solder layer 8, and the conductive member's recess 9C formed in front surface 9A of conductive member 9 is disposed so as to generally overlap second solder layer 8.

Case 10 is preferably made of, for example, PPS (polyphenylene sulfide) resin. The frame of case 10 has an inner side surface 10C facing a space surrounded by the frame of case 10. In FIG. 4, the case's inner side surface 10C on the right side in the figure in which a portion of conductive member 9, or vertically extending portion 9F, is embedded extends straight in the vertical direction in the figure, whereas the case's inner side surface 10C on the left side in the figure includes an inner side surface 10C1 and an inner side surface 10C2. However, this is an example and is not limited to such a manner. Further, in FIG. 4, a top portion of vertically extending portion 9F of conductive member 9 is exposed outside from a front surface 10A of case 10 and used as a connection terminal for external connection. Furthermore, in FIG. 4, a connection terminal 11 exposed outside of case 10 and externally connected may be formed by extending from inner side surface 10C2 via inner side surface 10C1 to front surface 10A, for example.

In addition, in FIG. 4 et seq. (except for some figures), from the viewpoint of facilitating the description of vertically extending portion 9F of conductive member 9 embedded in case 10, only case 10 on the right side in FIG. 4 and vertically extending portion 9F therein are shown in a cross section, and the other portions are shown in a side view as viewed from the front side.

With conductive member 9 and case 10 combined with insulating substrate 1, as shown in FIG. 4, a reflow process is performed to solder insulating substrate 1, semiconductor chip 5 and conductive member 9 together via first solder layer 4 and second solder layer 8. Specifically, insulating substrate 1, semiconductor chip 5 and conductive member 9 are heated. Then, insulating substrate 1 and semiconductor chip 5 are bonded by first solder layer 4, and semiconductor chip 5 and conductive member 9 are bonded by second solder layer 8. Thereby, first solder layer 4 serves as a first soldering portion 4S, and second solder layer 8 serves as a second soldering portion 8S. That is, conductive member 9 and case 10 combined with insulating substrate 1, as shown in FIG. 4, are heated in a reflow furnace, and previously supplied solder is melted and thereafter set to bond a component thereon and a component thereunder. At the same time, second solder layer 8 is melted by the heating and thereafter set to be second soldering portion 8S and thus bonds a component thereon and a component thereunder.

When first solder layer 4 melts and becomes first soldering portion 4S in the reflow process, the plurality of first provisional fixing portions 3 are also heated and set. Note that before first solder layer 4 is melted, a material (such as a solvent component) which is contained in first provisional fixing portion 3 and volatilizes at a temperature lower than the melting point of the solder volatilizes. Further, when second solder layer 8 is melted in the reflow process to be second soldering portion 8S, the plurality of second provisional fixing portions 7 are also heated and set. Similarly, before second solder layer 8 is melted, a material (such as a solvent component) which is contained in second provisional fixing portion 7 and volatilizes at a temperature lower than the melting point of the solder volatilizes. Second provisional fixing portion 7 covered with a portion of a surface of second solder layer 8 suffices, and may or may not be in contact with an end face of second soldering portion 8S.

When first provisional fixing portion 3 and second provisional fixing portion 7 include a sinterable metal material of silver, silver diffuses into first solder layer 4 and second solder layer 8. This makes gradually unclear the boundary between first provisional fixing portion 3 and first solder layer 4 and the boundary between second provisional fixing portion 7 and second solder layer 8. That is, a center of a location where first provisional fixing portion 3/second provisional fixing portion 7 is disposed has a highest concentration of silver, and the concentration of silver gradually decreases as a distance to the center increases. For this reason, in reality, in FIG. 4 et seq., the boundary between first provisional fixing portion 3 and first solder layer 4 and the boundary between second provisional fixing portion 7 and second solder layer 8 are not clear as shown in each figure and visually no longer exist. However, FIG. 4 et seq. show first provisional fixing portion 3 and second provisional fixing portion 7 from the viewpoint of schematically showing a region in which first provisional fixing portion 3 and the like originally existed.

Figure 5:
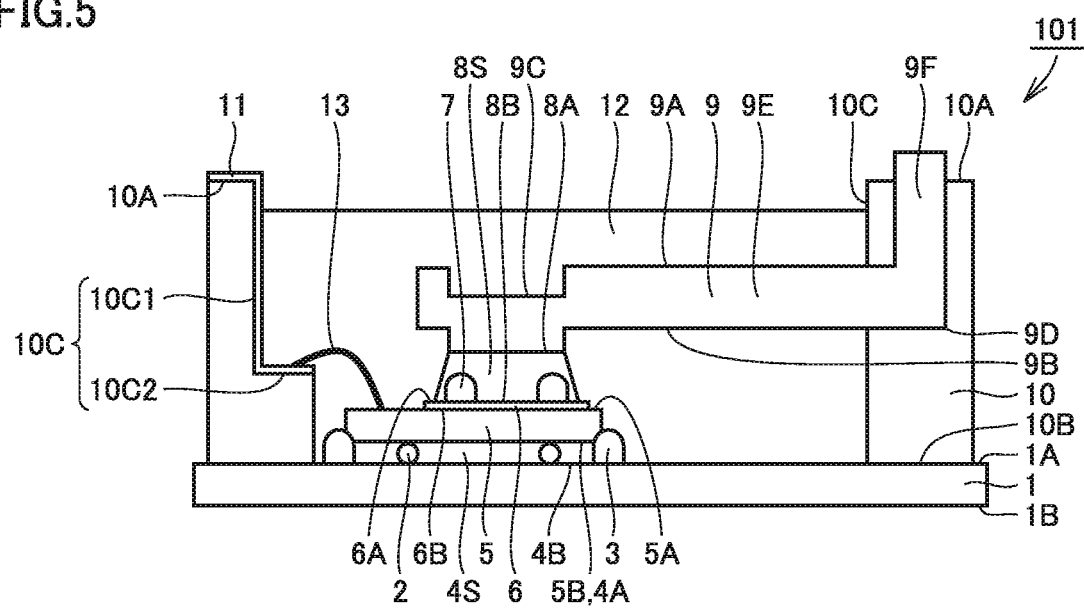
FIG. 5 is a schematic side view showing a fifth step of the method for manufacturing a power module in the first embodiment of the present invention.

Referring to FIG. 5, after insulating substrate 1, semiconductor chip 5 and conductive member 9 are soldered and thus integrated together through the step shown in FIG. 4, connection terminal 11 is connected via a bonding wire 13 to a gate electrode (not shown) on front surface 5A of semiconductor chip 5 for example. Preferably, bonding wire 13 is made of, for example, a generally known thin wire of aluminum, and its cross section is a circle having a diameter of 200 μm, for example. A sealing resin 12 such as a generally known epoxy resin is injected and thus introduced into a portion in the form of a container defined by front surface 1A of insulating substrate 1 and inner side surface 10C of case 10. Thus, semiconductor chip 5, horizontally extending portion 9E of conductive member 9, and the like in the portion in the form of the container are sealed by sealing resin 12. A power module 101 as a semiconductor device of the present embodiment is thus formed through the above steps.

Hereinafter, although some portions overlap the above, power module 101 formed through the above-described steps will be described with reference to FIG. 6.

Figure 6A:
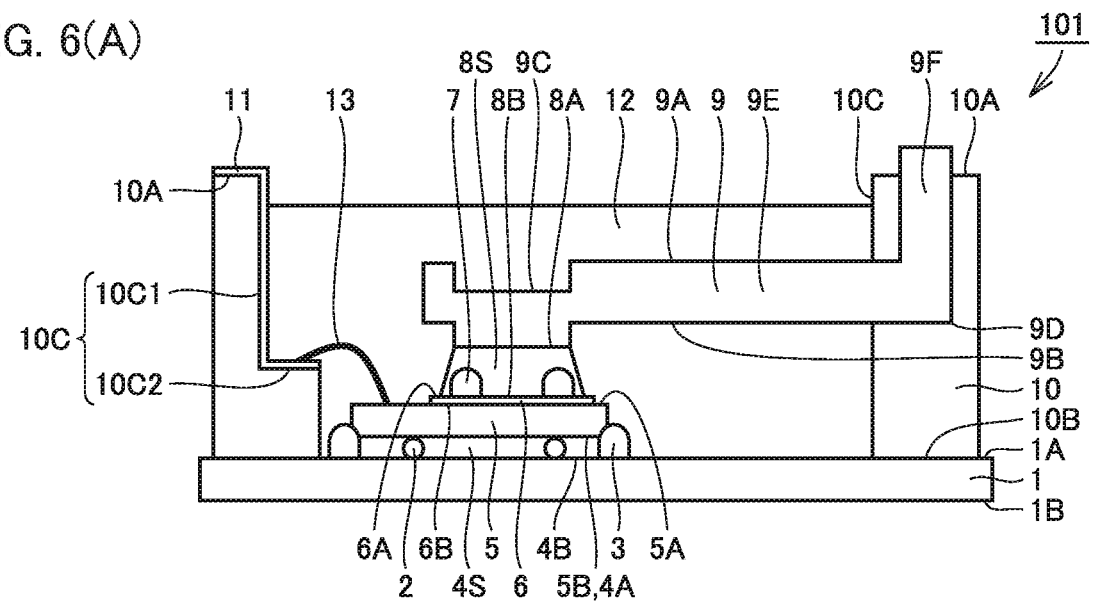
FIG. 6(A) is a schematic side view and FIG. 6(B) is a schematic plan view showing a configuration of a power module according to a first example of the first embodiment of the present invention.
Figure 6B:
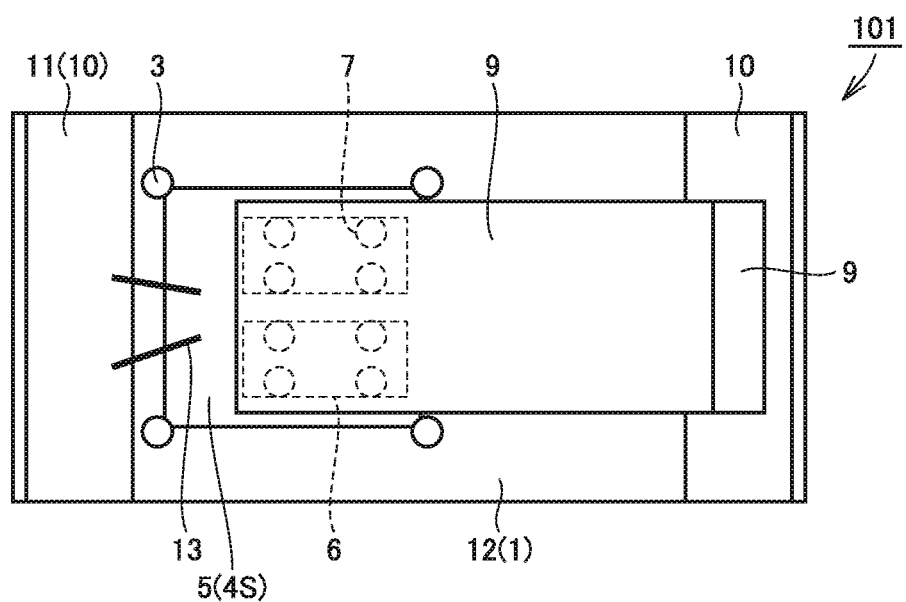

With reference to FIGS. 6(A) and 6(B), in power module 101, semiconductor chip 5 is disposed on insulating substrate 1 and conductive member 9 in the form of a flat plate is disposed on semiconductor chip 5. Insulating substrate 1 and semiconductor chip 5 are bonded by first soldering portion 4S. Semiconductor chip 5 and conductive member 9 are bonded by second soldering portion 8S.

A first mixture region 3 is disposed on surface 1A of insulating substrate 1 as a plurality of first regions, e.g., four first regions, such that they are mutually spaced and thus dispersed. As has been set forth above, a boundary line of an outermost portion of a region where first provisional fixing portion 3 and second provisional fixing portion 7 each originally existed does not exist in reality in power module 101 shown in FIGS. 6(A) and 6(B) and the like. However, the region which was originally first provisional fixing portion 3 is a region which includes a metal material different in composition than first soldering portion 4S. Furthermore, the region which was originally second provisional fixing portion 7 is a region which includes a metal material different in composition than second soldering portion 8S. Thus, from the viewpoint of visualizing regions where a metal material is different in composition than the surroundings, these are schematically shown as a first mixture region 3 and a second mixture region 7 (as a second region).

First mixture region 3 is disposed such that a plurality of first mixture regions 3, e.g., four first mixture regions 3, are disposed in the same layer as first soldering portion 4S and spaced from each other. Herein, first mixture region 3 is disposed at each of four corners of a rectangular shape of first soldering portion 4S viewed in a plan view. First mixture region 3 is formed as follows: solder contained in first solder layer 4 from which first soldering portion 4S is formed and a metal material contained in first provisional fixing portion 3 are mixed together as they are heated and melted. By this mixture, first mixture region 3 has a composition with a smaller solder content than first soldering portion 4S and a larger metal content of first provisional fixing portion 3 than first soldering portion 4S.

Note that first soldering portion 4S at its center portion and a region outer than the center portion and relatively far away from first mixture region 3 in a plan view has substantially the same composition as that of its source or first solder layer 4. That is, the portion is substantially composed of solder.

Similarly, second mixture region 7 is disposed such that a plurality of second mixture regions 7, e.g., four second mixture regions 7, are disposed in the same layer as second soldering portion 8S and spaced from each other. Herein, second mixture region 7 is disposed at each of four corners of a rectangular shape of second soldering portion 8S viewed in a plan view. Second mixture region 7 is formed as follows: solder contained in second solder layer 8 from which second soldering portion 8S is formed and a metal material contained in second provisional fixing portion 7 are mixed together as they are heated and melted. By this mixture, second mixture region 7 has a composition with a smaller solder content than second soldering portion 8S and a larger metal content of second provisional fixing portion 7 than second soldering portion 8S.

Note that second soldering portion 8S at its center portion and a region outer than the center portion and relatively far away from second mixture region 7 in a plan view has substantially the same composition as that of its source or second solder layer 8. That is, the portion is substantially composed of solder.

Semiconductor chip 5 is disposed on the plurality of first mixture regions 3. Semiconductor chip 5 is disposed generally at a position above first mixture region 3 such that semiconductor chip 5 partially overlies a surface of each of the plurality of first mixture regions 3 and is partially in contact with first mixture region 3 together with first soldering portion 4S. Thus the plurality of first mixture regions 3 is each in contact with both insulating substrate 1 and semiconductor chip 5. Thus, a form as power module 101 is established. And the plurality of first mixture regions 3 each has a portion buried in first soldering portion 4S. Between front surface 1A of insulating substrate 1 and back surface 5B of semiconductor chip 5, first soldering portion 4S having a rectangular shape is interposed, and front surface 4A of first soldering portion 4S is in contact with back surface 5B and back surface 4B of first soldering portion 4S is in contact with front surface 1A. The plurality of first mixture regions 3 are disposed so as to overlap four corners in a plan view of first soldering portion 4S of the rectangular shape.

Wire bumps 2 disposed so as to be in contact with front surface 1A of insulating substrate 1 are disposed from such a viewpoint that the thickness of first soldering portion 4S ensures in its entirety at least the diameter of the circular shape in cross section of wire bump 2. The thickness is substantially fixed as wire bumps 2 are disposed in contact with both front surface 1A of insulating substrate 1 and back surface 5B of semiconductor chip 5 and first soldering portion 4S is disposed throughout the region sandwiched between front surface 1A and back surface 5B to fill that region.

For example, while two top electrodes 6 as a member constituting semiconductor chip 5 are disposed on front surface 5A of semiconductor chip 5 such that top electrodes 6 are spaced from each other, top electrodes 6 is not limited in number to two. Although not shown, a metal film for example of nickel is formed on front surface 6A of top electrode 6. The metal film of nickel allows top electrode 6 and second solder layer 8 thereon to be bonded in a good state. A plurality of, for example, four second mixture regions 7 are disposed on each top electrode 6 such that second mixture regions 7 are spaced from each other. Second mixture region 7 is bonded to second soldering portion 8S or the like so as to have a composition different from that of second soldering portion 8S. Specifically, for example, second mixture region 7 has a concentration of silver or gold higher than an area that surrounds second mixture region 7 does by an amount contained in second provisional fixing portion 7, for example. Each second mixture region 7 is (e.g., entirely) buried in second soldering portion 8S.

Second soldering portion 8S having a rectangular shape is disposed on front surface 6A of top electrode 6 so as to partially overlie the plurality of second mixture regions 7, and conductive member 9 in the form of a flat plate is disposed on front surface 8A of second soldering portion 8S, that is, above the plurality of second mixture regions 7. The plurality of second provisional fixing portions 7 are disposed so as to overlap four corners in a plan view of second soldering portion 8S of the rectangular shape.

As has been described above, insulating substrate 1 and semiconductor chip 5 are bonded by first soldering portion 4S, and semiconductor chip 5 and conductive member 9 are bonded by second soldering portion 8S. Thus, semiconductor chip 5 and conductive member 9 are electrically connected by second soldering portion 8S.

In power module 101, first mixture region 3 and second mixture region 7 are set at a temperature lower than the melting point of the solder. This is because first provisional fixing portion 3 and second provisional fixing portion 7 include a material which is set at a temperature lower than the melting point of the solder in the reflow process.

By analyzing a finished product of power module 101, it can be verified that first mixture region 3 and second mixture region 7 are disposed in contact with first soldering portion 4S and second soldering portion 8S, respectively, generally as shown in FIG. 6.

Conductive member 9 is a member in the form of a plate formed for example by pressing. Conductive member 9 is bonded on semiconductor chip 5 by second soldering portion 8S, and in that state, conductive member 9 covers a half or more of an area of semiconductor chip 5 in a plan view, that is, an area of 112.5 $mm^2$ or more in the above case. Conductive member 9 has a thickness for example of 1 mm.

Figure 7A:
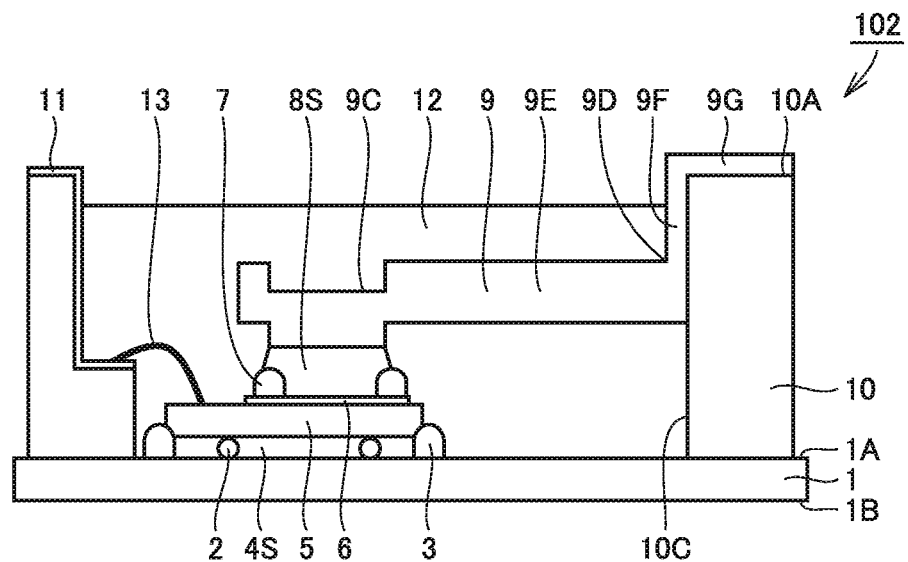
FIG. 7(A) is a schematic side view and FIG. 7(B) is a schematic plan view showing a configuration of a power module according to a second example of the first embodiment of the present invention.
Figure 7B:
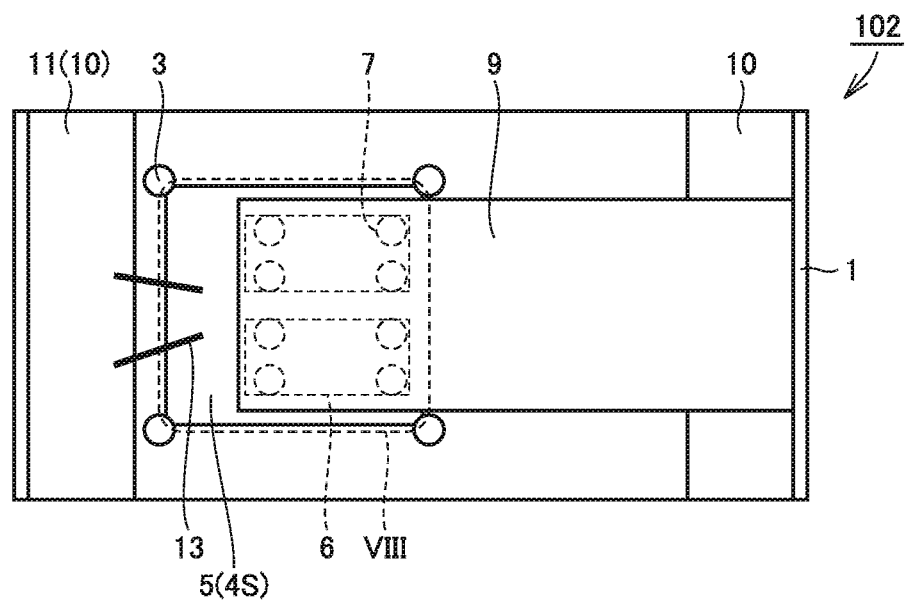

With reference to FIGS. 7(A) and 7(B), a power module 102 as a semiconductor device of a second example of the present embodiment basically has a configuration similar to that of power module 101 of the first example, and accordingly, identical components are identically denoted and will not be described repeatedly. Note, however, power module 102 is different from power module 101 integrated with case 10 through an insert molding process in that conductive member 9 is integrated with case 10 though an outsert molding process. That is, in FIG. 7, conductive member 9 has a bent portion 9D at two locations, and includes horizontally extending portion 9E, vertically extending portion 9F, and furthermore, a horizontally extending portion 9G. Vertically extending portion 9F extends upward and downward on the case's inner side surface 10C, and horizontally extending portion 9G overlies front surface 10A and extends rightward and leftward on front surface 10A. In this manner, conductive member 9 is formed integrally with the case's inner side surface 10C and front surface 10A. Conductive member 9 may be of any manner of power modules 101 and 102.

Hereinafter, a function and effect of the present embodiment will be described.

If in the present embodiment there should be no steps of supplying the plurality of first provisional fixing portions 3 so as to be dispersed on front surface 1A of insulating substrate 1 and supplying the plurality of second provisional fixing portions 7 so as to be dispersed on front surface 5A of semiconductor chip 5, it would be necessary to take measures to prevent positional displacement between first solder layer 4 and semiconductor chip 5. Specifically, for example, a first reflow process is performed to bond insulating substrate 1 and semiconductor chip 5 together while semiconductor chip 5 is positionally fixed with respect to insulating substrate 1 by using a positional displacement preventing jig providing a wall surrounding a location where semiconductor chip 5 is mounted. Thereafter, case 10 is attached to insulating substrate 1, second solder layer 8 is supplied, and top electrode 6 on semiconductor chip 5 and conductive member 9 in the form of a plate undergo a second reflow process. Thus, semiconductor chip 5 and conductive member 9 are bonded together. Thus when first provisional fixing portion 3 and second provisional fixing portion 7 are not used, it is necessary to perform a reflow process twice for bonding the members.

Referring again to FIG. 7, conductive member 9 is integrated with case 10, and conductive member 9 is disposed at a position desired with respect to case 10. For this reason, if first soldering portion 4S under semiconductor chip 5 is positionally displaced, it would be difficult to bond semiconductor chip 5 and conductive member 9 by second soldering portion 8S disposed on semiconductor chip 5. Furthermore, if first soldering portion 4S under semiconductor chip 5 is positionally displaced, a path for passing a current through semiconductor chip 5 will not have a necessary cross-sectional area. For this reason, the path for the current presents increased electrical resistance when the current is passed through semiconductor chip 5. As a result, semiconductor chip 5 generates an increased amount of heat and may be impaired in reliability.

Referring to FIG. 8 together with FIGS. 3, 4 and 7, on an upper surface of semiconductor chip 5, a pad 16 is disposed for connecting a bonding wire 13 shown in FIG. 7. Pad 16 is not shown in FIG. 7(B). If in FIG. 3 and FIG. 4 second solder layer 8 on semiconductor chip 5 is positionally displaced and disposed to directly overlap pad 16, poor bondability of bonding wire 13 is a matter of concern in a subsequent step of connecting bonding wire 13.

Further, a guard ring 17 is disposed at an outer periphery of a surface of semiconductor chip 5. Guard ring 17 is a member for ensuring insulation from each member outside of semiconductor chip 5. If second solder layer 8 is positionally displaced and as a result second soldering portion 8S is formed at a position overlapping guard ring 17 such that it comes into contact with guard ring 17, reduction in withstand voltage of semiconductor chip 5 due to guard ring 17 is a matter of concern. Furthermore, if second solder layer 8 is positionally displaced, it interrupts a flow of sealing resin 12 introduced to enter a region between semiconductor chip 5 and conductive member 9. If the region between semiconductor chip 5 and conductive member 9 has a portion which is not filled with sealing resin 12, a cavity is formed in the region and poor insulation caused thereby is also a matter of concern.

In contrast, in the present embodiment, first solder layer 4 and semiconductor chip 5 are disposed on front surface 1A of insulating substrate 1 via a plurality of first provisional fixing portions 3 and second solder layer 8 and conductive member 9 are disposed thereon via a plurality of second provisional fixing portions 7, and these are soldered together through a reflow process. Since semiconductor chip 5 is provisionally fixed with respect to insulating substrate 1 by the viscosity of first provisional fixing portion 3 and in that condition conductive member 9 is disposed such that it is provisionally fixed with respect to semiconductor chip 5 by second provisional fixing portion 7, these members can all be bonded together to have high positional accuracy through a reflow process performed only once. Thus, with first provisional fixing portion 3 or the like suppressing positional displacement between the members while they are handled and conveyed before the reflow process, power module 101 can be manufactured with high productivity through a reflow process performed only once.

Performing the reflow process less frequently can reduce a period of time for which semiconductor chip 5 is exposed to the air. This can reduce a risk of poor characteristics such as reduced withstand voltage caused as foreign matters such as cellulose and polyester adhere to a surface of semiconductor chip 5.

Such an effect can be achieved by first provisional fixing portion 3 and second provisional fixing portion 7 having viscosity in a temperature range from room temperature to the melting point of the solder. Room temperature as referred to herein means a room temperature of a room in which a device which has semiconductor chip 5 mounted therein/thereon and a reflow furnace are installed, i.e., 15° C., or higher. The solder has a melting point of 220° C., for the sake of illustration. This is because the viscosity that first provisional fixing portion 3 and second provisional fixing portion 7 have in a state before the reflow process can be used for provisional fixation.

Since first provisional fixing portion 3 and second provisional fixing portion 7 are thermosetting, they are thermally set by the heat of the reflow process. However, it is preferable that first provisional fixing portion 3 and second provisional fixing portion 7 be made of a material that is set at a temperature lower than the melting point of the solder. This allows first provisional fixing portion 3 and second provisional fixing portion 7 to be solidified by heating at the time of reflowing. For this reason, even if case 10 is thermally deformed during the reflow process and conductive member 9 in the form of a plate is inclined so that a distance between conductive member 9 and semiconductor chip 5 becomes smaller than a designed value, at least the distance between conductive member 9 and semiconductor chip 5 can be maintained to be equal to or greater than a height (or thickness) of second provisional fixing portion 7 assumed after fixation. This is because conductive member 9 at least coming into contact with second mixture region 7 solidified is prevented from further inclining and moving toward semiconductor chip 5. This can reduce a possibility for example of conductive member 9 and semiconductor chip 5 having therebetween a distance extremely reduced so as to prevent sealing resin 12 from flowing into and filling a region between conductive member 9 and semiconductor chip 5.

Subsequently, in the present embodiment, in power module 101 formed through the above-described steps, the plurality of first provisional fixing portions 3 and the plurality of second provisional fixing portions 7 are disposed such that they are dispersed. If first and second provisional fixing portions 3 and 7 are supplied to the entirety of an outer periphery of semiconductor chip 5 or the entirety of a region overlapping semiconductor chip 5 in a plane, no gas escape path can be ensured and first and second soldering portions 4S, 8S may have voids formed therein. By forming first provisional fixing portion 3 and second provisional fixing portion 7 which are dispersed as done in the present embodiment, it is possible to expel voids from a region of a gap free of the adhesives, and hence reduce a possibility of voids remaining in first and second soldering portions 4S, 8S. Thus, first soldering portion 4S and second soldering portion 8S providing large heat radiation are formed.

First provisional fixing portion 3 and second provisional fixing portion 7 include a material which volatilizes in the reflow process at a temperature lower than the melting point of the solder. As a result, while the viscosity or the like of a member constituting first provisional fixing portion 3 or the like is maintained, first mixture region 3 or the like finally obtained does not contain a volatile material and can include a desired metal material alone.

First provisional fixing portion 3 and second provisional fixing portion 7 include a sinterable metal material, such as silver, which is sintered at a temperature lower than the melting point of the solder in the reflow process. Diffusing silver can change the solder material of first solder layer 4 and second solder layer 8 only at an outer peripheral portion of semiconductor chip 5 where shrinkage cavity may be formed to a composition which does not easily form shrinkage cavity during a heating process. The composition which does not easily form shrinkage cavity is, for example, a composition of a Sn—Ag—Cu-based solder material.

The plurality of first mixture regions 3 are disposed so as to overlap four corners in a plan view of first soldering portion 4S of the rectangular shape, and the plurality of second mixture regions 7 are disposed so as to overlap four corners in a plan view of second soldering portion 8S of the rectangular shape. Thus the plurality of first mixture regions 3 is each in contact with both insulating substrate 1 and semiconductor chip 5. Furthermore, first and second mixture regions 3 and 7 include silver.

The four corners of each of first and second soldering portions 4S and 8S are locations which experience stress concentration due to a thermal cycle in the reflow process and are thus likely to be a starting point of cracking. By disposing silver-containing, first and second mixture regions 3 and 7 at these locations, the silver is diffused in the four corners of each of first and second soldering portions 4S and 8S, and a needle-shaped intermetallic compound such as $Ag_3Sn$ is produced. Thus the four corners of each of first and second soldering portions 4S and 8S are reinforced by the needle-like intermetallic compound in the structure of each soldering portion and thus increased in mechanical strength as compared with the other regions thereof. This can suppress development of cracking at the corners of first and second soldering portions 4S and 8S that are likely to be a starting point of cracking. In addition, first and second soldering portions 4S and 8S of high reliability can be obtained, and hence power module 101 of high reliability can be obtained. Furthermore, the silver contained in first and second mixture regions 3 and 7 has high thermal conductivity, which can improve heat radiation in the regions toward insulating substrate 1, that is, downward in FIG. 5.

Note that second provisional fixing portion 7 on semiconductor chip 5 and second mixture region 7 in the finished product may be located at a center portion of second solder layer 8 in a plan view. This can reduce a possibility of poor insulation otherwise caused in the finished product as second mixture region 7 including a metal protrudes from an area on semiconductor chip 5 in which second soldering portion 8S is disposed.

In addition, in the present embodiment, a conductive member in the form of a flat plate is disposed on second solder layer 8. When the conductive member is compared with a bonding wire, for example, the former increases a path for a current in cross section and thus allows the path to be of high energy density. As a result, when the conductive member is compared with the bonding wire, the former allows the power module to be miniaturized.

Hereinafter, a modification of each member which configures power modules 101, 102 of the present embodiment above will be described.

In the above description, insulating substrate 1 has a configuration in which an aluminum layer, an aluminum nitride layer, and an aluminum layer are stacked in the stated order. However, this is not a limitation, and for example, the second, insulating material layer may not be an aluminum nitride layer, and may instead be of a ceramic material, such as an alumina layer ($Al_2O_3$) and a silicon nitride layer ($Si_3N_4$). Also, for example, as the first and third, metal material layers, the aluminum layer may be replaced with a copper layer or the like. Further, insulating substrate 1 is not limited in size in a plan view or thickness. In addition, although a nickel plating layer is further formed on front surface 1A of insulating substrate 1, a thin film such as gold or titanium may be formed instead of nickel, and its thickness's numerical range is not limited to the above, either. A heat sink such as cooling fins may be attached on back surface 1B of insulating substrate 1 through, for example, a casting process or a forging process. The heat sink such as these fins may be formed by brazing.

While wire bump 2 is made of aluminum in the above, they are not limited as such and may be made of silver or copper. Further, the diameter of the circular cross section of wire bump 2 is not limited to 100 μm as described above, and any diameter may be used insofar as it is equal to or less than the thickness of first solder layer 4. As described above, finally, the thickness of first soldering portion 4S is equal to or more than the diameter of the circular cross section of wire bump 2. Wire bump 2 may not necessarily be disposed.

By making wire bump 2 of silver or copper, silver or copper diffuses into first solder layer 4 and thus forms a needle-like intermetallic compound such as $Ag_3Sn$, which is dispersed in the structure of the solder of first solder layer 4. This can enhance first solder layer 4 in mechanical strength, and hence first soldering portion 4S in reliability.

First provisional fixing portion 3 and second provisional fixing portion 7 for example include silver for the sake of illustration. However, this is not a limitation, and first provisional fixing portion 3 and second provisional fixing portion 7 may include metal such as gold or copper. Any material that is set at a temperature lower than the temperature of the reflow process and has sufficient heat resistance to the temperature of the reflow process is applicable to first provisional fixing portion 3 and second provisional fixing portion 7. Furthermore, first provisional fixing portion 3 and second provisional fixing portion 7 are not limited to being of one-component and may be of two-component. Moreover, first provisional fixing portion 3 and second provisional fixing portion 7 may be identical or different in material. First provisional fixing portion 3 and second provisional fixing portion 7 may be pasty solder, insofar as it provisionally fixes semiconductor chip 5 and conductive member 9 effectively, as described above.

First solder layer 4 (first soldering portion 4S) and second solder layer 8 (second soldering portion 8S) are not limited to an alloy of Sn and Cu, and may be of solder of a different material. Furthermore, first solder layer 4 and second solder layer 8 do not have to be identical in material and may be of different materials. Furthermore, in the above description, second solder layer 8 is thicker than first solder layer 4, and as a result, second soldering portion 8S is formed to be thicker than first soldering portion 4S. However, this is not a limitation, and for example, first solder layer 4 may be equal to or larger than second solder layer 8 in thickness.

The device mounted in/on semiconductor chip 5 is not limited to an IGBT. That is, an IC (integrated circuit), a thyristor or a MOSFET (Metal Oxide Semiconductor Field Effect Transistor) may be mounted in/on semiconductor chip 5. As still another example, the device mounted in/on semiconductor chip 5 may be a rectifying device such as SBD (Schottky Barrier Diode) and SBJ (Schottky Barrier Junction), or may be applied to a semiconductor package other than a power module. Semiconductor chip 5 is not limited in size in a plan view or thickness to the above.

While two top electrodes 6 may be provided on front surface 5A of semiconductor chip 5, as shown in FIGS. 6 and 7, this is not a limitation, and for example, only one top electrode 6 or three or more top electrodes 6 may be provided. Further, as top electrode 6, any material that can ensure good bondability with second solder layer 8 thereon can be used, and it is not limited to nickel, and for example, it may be gold or titanium.

Conductive member 9 in the form of a flat plate is not limited to copper, as described above, and may be made of aluminum or the like. Conductive member 9 may be formed of a clad material comprising copper and a structure of a plurality of metal materials, such as Invar, joined together. Alternatively, conductive member 9 may have a configuration in which a thin film of metal such as nickel or gold is formed on a surface of a main body of copper. Conductive member 9 is not limited in thickness to 1 mm as set forth above.

Case 10 is not limited in material to the aforementioned PPS resin, and may be made of PBT (polybutylene terephthalate) resin unless it is deformed by high temperature in the reflow process.

While sealing resin 12 is epoxy resin in the above description, sealing resin 12 is not limited thereto and may be a gel or the like that can ensure insulation.

Bonding wire 13 may be used not only for gate wiring but also for wiring for an emitter sense or temperature sense diode or the like. Bonding wire 13 is not limited in material to aluminum, and may be of copper or the like. Furthermore, its circular cross section's diameter is not limited to 200 μm as described above.

Second Embodiment

Figure 11:
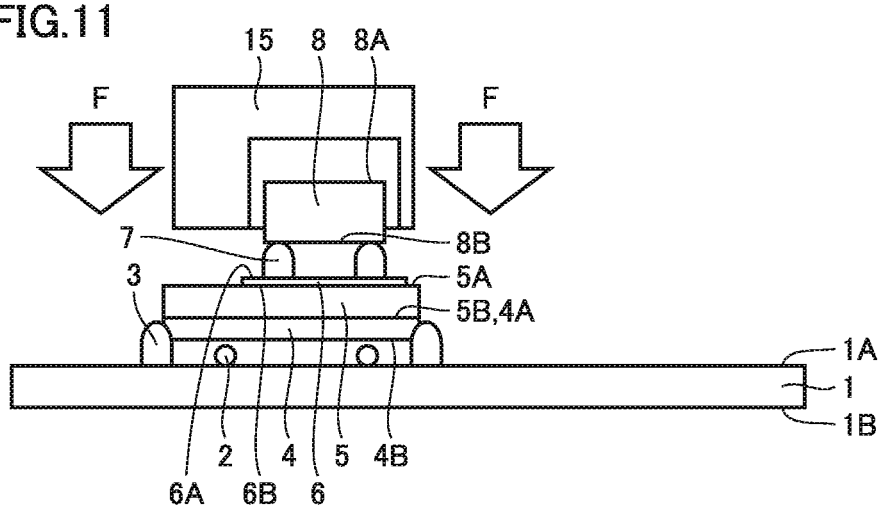
FIG. 11 is a schematic side view showing a third step of the method for manufacturing a power module in the second embodiment of the present invention.

Initially, a method for manufacturing a power module according to the present embodiment will be described with reference to FIGS. 9 to 11. The method for manufacturing the power module according to the present embodiment is basically the same as the method for manufacturing the power module according to the first embodiment shown in FIGS. 1 to 5, and accordingly, will not be described for any similar step. Furthermore, in the following, any component identical to that in the first embodiment is identically denoted and the component will not be described repeatedly.

Referring to FIG. 9, in the present embodiment, after semiconductor chip 5 on which top electrode 6 is formed is disposed in the step shown in FIG. 2, front surfaces 5A and 6A of semiconductor chip 5 and top electrode 6 receive pressure (or are pressed) from above by a pressing jig 14 downward. FIG. 10 shows a state after the FIG. 9 pressing step is performed. Referring to FIG. 11, after second provisional fixing portion 7 and second solder layer 8 are disposed in the FIG. 3 step and before conductive member 9 is disposed, first solder layer 4, second solder layer 8 and semiconductor chip 5 stacked in layers are pressed by a pressing jig 15 toward insulating substrate 1, that is, downward. As shown in FIGS. 9 to 11, after the step of pressing semiconductor chip 5 and first solder layer 4, they may be pressed again together with second solder layer 8 deposited thereon after the step. Alternatively, after second solder layer 8 is deposited, the pressing step may be performed only once to press the stack of first solder layer 4, second solder layer 8 and semiconductor chip 5 downward.

The semiconductor device finally formed through the above process according to the present embodiment is power modules 101 and 102 similar to the first embodiment.

Figure 12:
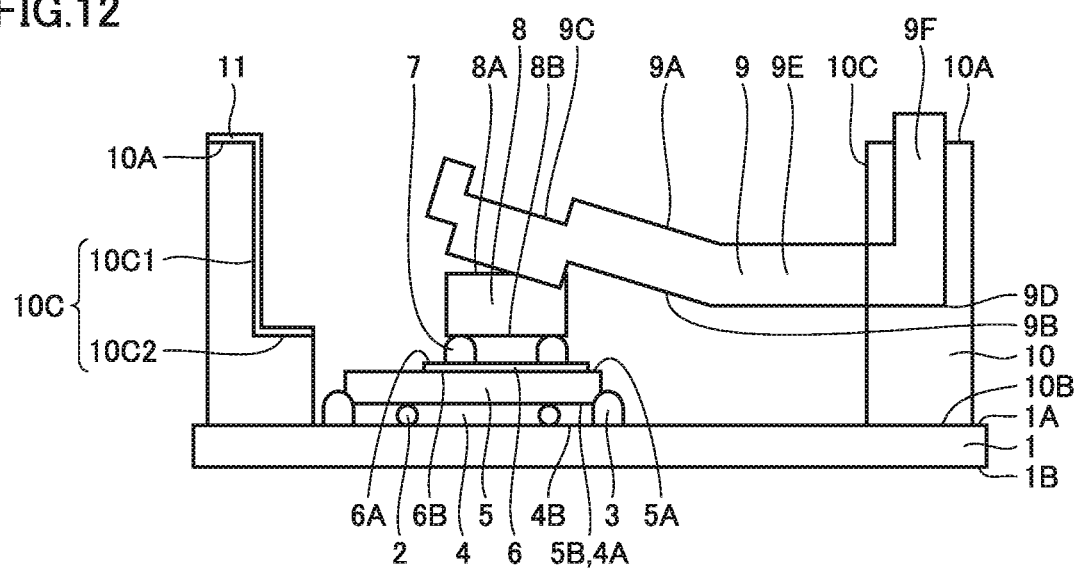
FIG. 12 is a schematic side view showing a first example of a defect in a comparative example.

Hereinafter, a function and effect of the present embodiment will be described with reference to FIGS. 12 and 13. In addition to the same effect as the first embodiment, the present embodiment has a function and effect as follows:

Referring to FIG. 12, if the above pressing step is not performed and there is a gap between the stacked members before the reflow process is performed, and case 10 is mounted on front surface 1A of insulating substrate 1, there is a possibility that conductive member 9 in the form of a plate may be deformed to bend. When conductive member 9 is deformed, sufficient fillet may not be formed for second solder layer 8 after the reflow process, which may impair the reliability of bonding by second solder layer 8.

Further, referring to FIG. 13, there is a possibility of a defect, that is, case 10 may be detached from front surface 1A of insulating substrate 1. Such a state invites a possibility a defect, that is, sealing resin 12 may externally leak from the portion in the form of a container that is defined by insulating substrate 1 and case 10 through a gap formed as case 10 is detached.

Furthermore, a case is considered in which pressing in a state with heating done to attain solder's melting temperature is done to provide a thickness smaller than a total in thickness of first solder layer 4, semiconductor chip 5 and second solder layer 8. In that case, the pressing may cause first solder layer 4 and second solder layer 8 to protrude outside a region to be thereby bonded, and may thereby cause poor insulation.

In contrast, as in the present embodiment, when in a stage where the members are stacked in layers before they are introduced into the reflow process a pressing step is performed using pressing jigs 14 and 15, a gap between the members can be removed and such a defect as shown in FIGS. 12 and 13 can be suppressed. In addition, protrusion of solder that can be caused when pressing is done after the solder is heated, and hence poor insulation resulting therefrom can be suppressed.

The above pressing step may be performed during heating, such as the reflow process, if pressing jigs 14 and 15 can be controlled to be displaced so as not to provide a thickness smaller than a total in thickness of first solder layer 4, semiconductor chip 5 and second solder layer 8. This allows a volatile component contained in first and second provisional fixing portions 3 and 7 to escape therefrom and can thus provide power module 101 which does not easily cause voids and thus provides excellent heat radiation.

Third Embodiment

Initially, a method for manufacturing a power module of the present embodiment will be described with reference to FIGS. 14 to 19. The method for manufacturing the power module according to the present embodiment is basically the same as the method for manufacturing the power module according to the first embodiment shown in FIGS. 1 to 5, and accordingly, will not be described for any similar step. Furthermore, in the following, any component identical to that in the first embodiment is identically denoted and the component will not be described repeatedly.

Referring to FIG. 14, in the present embodiment as well, similarly as done in the FIG. 1 step, wire bumps 2 are disposed on front surface 1A of insulating substrate 1, and first provisional fixing portion 3 is supplied at four locations so as to surround wire bumps 2 outside in a plan view in a direction in which wire bumps 2 are aligned, and form a rectangle or a square. Note, however, that in the present embodiment a width of a pair of adjacent first provisional fixing portions 3A in a direction along front surface 1A may be narrower than in the first embodiment. That is, herein, preferably, first provisional fixing portions 3A are supplied such that when they are connected together they form a rectangle or a square having a size smaller than that in a plan view of the first solder layer and the semiconductor chip to be mounted later.

Referring to FIG. 15, similarly as done in the FIG. 2 step, first solder layer 4 to be the first soldering portion is disposed in contact with the plurality of first provisional fixing portions 3A. Note that, as has been set forth above, when first provisional fixing portions 3 are connected together they form a rectangle or the like having a smaller size than in the first embodiment, and accordingly, it is preferable that first provisional fixing portion 3 is entirely in contact with back surface 4B of first solder layer 4 and is not disposed in a region outside an end face of first solder layer 4.

Figure 16:
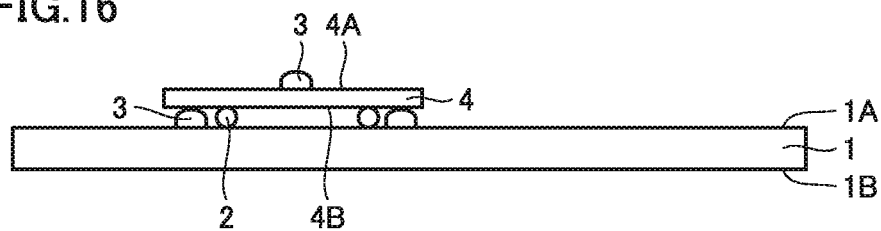
FIG. 16 is a schematic side view showing a third step of the method for manufacturing a power module in the third embodiment of the present invention.

Referring to FIG. 16, after the step of disposing first solder layer 4 and before the step of disposing semiconductor chip 5, a plurality of additional first provisional fixing portions 3 are supplied on front surface 4A of first solder layer 4 such that the plurality of additional first provisional fixing portions 3 are spaced from each other and thus dispersed. Herein, first provisional fixing portion 3 is supplied at a position overlapping in a plan view a midpoint of each of four sides of a rectangle formed by connecting first provisional fixing portions 3 disposed at the four locations described above. As a result, a plurality of first provisional fixing portions 3 sandwich and thus overlie and underlie first solder layer 4.

Figure 17:
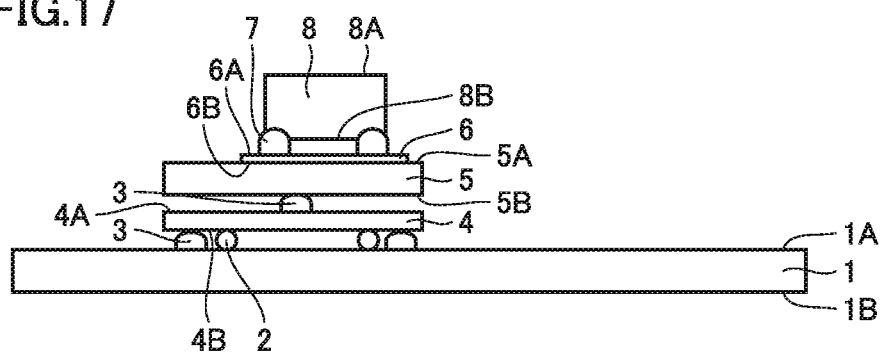
FIG. 17 is a schematic side view showing a fourth step of the method for manufacturing a power module in the third embodiment of the present invention.
Figure 18:
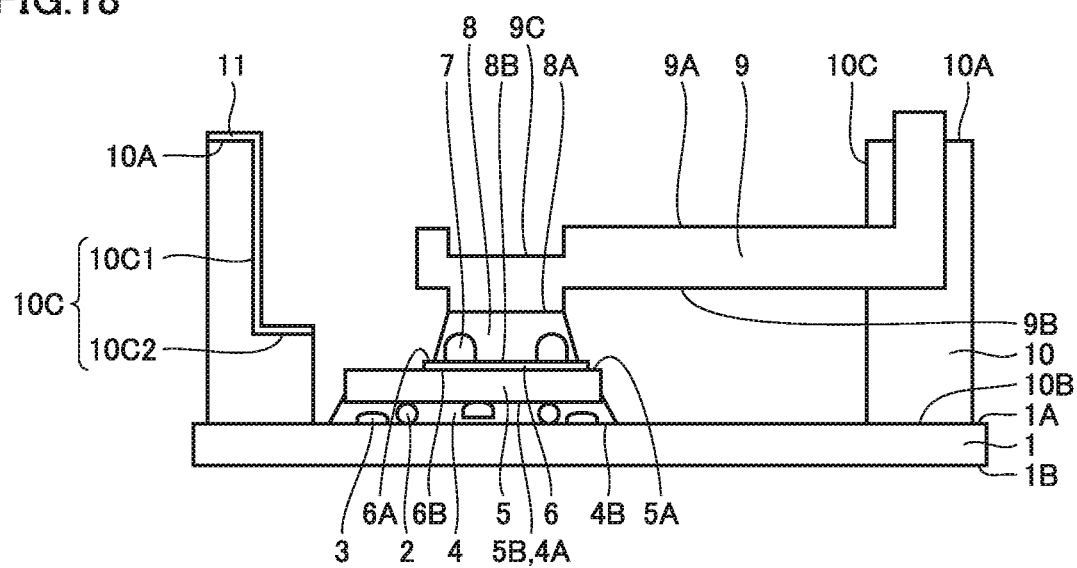
FIG. 18 is a schematic side view showing a fifth step of the method for manufacturing a power module in the third embodiment of the present invention.
Figure 19:
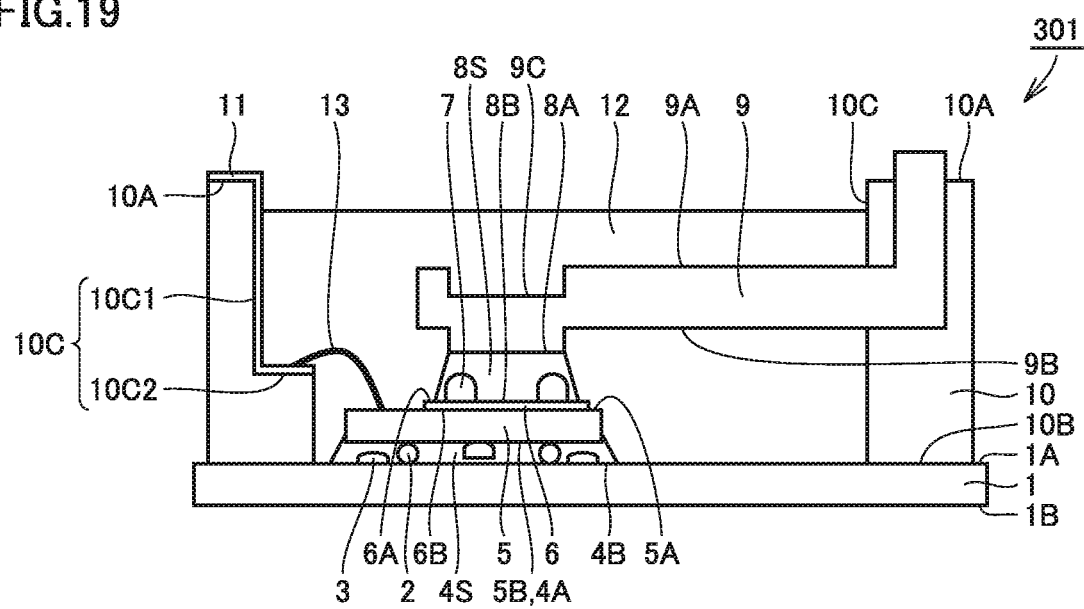
FIG. 19 is a schematic side view showing a sixth step of the method for manufacturing a power module in the third embodiment of the present invention.

Referring to FIG. 17, semiconductor chip 5 is disposed on first provisional fixing portions 3B additionally supplied as shown in FIG. 16. Referring to FIGS. 18 and 19, subsequent steps of setting conductive member 9 and case 10 and the like and reflowing are the same as those of the first embodiment shown in FIGS. 4 and 5. A power module 301 as a semiconductor device of the present embodiment is thus formed through the above steps.

Figure 20A:
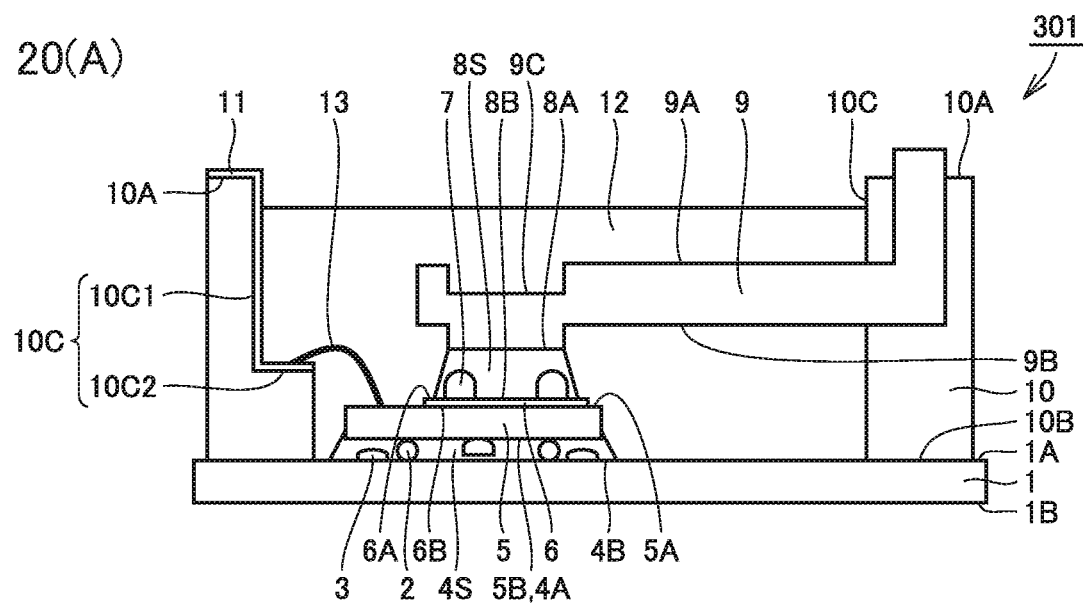
FIG. 20(A) is a schematic side view and FIG. 20(B) is a schematic plan view showing a configuration of the power module according to the third embodiment of the present invention.
Figure 20B:
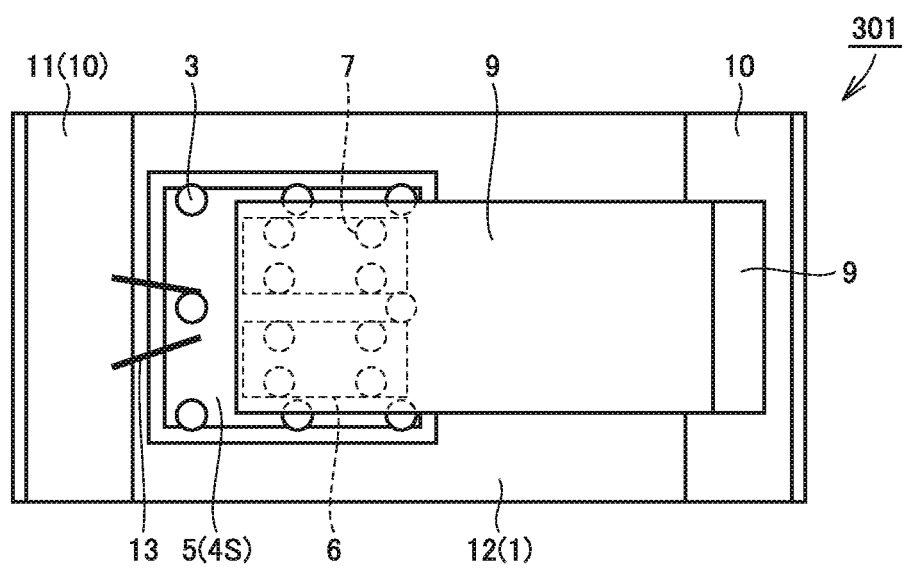

Referring to FIGS. 20(A) and 20(B), power module 301 formed through the above steps is configured such that the plurality of first mixture regions 3, in FIG. 20(A), as seen in an upward and downward direction, that is, a direction in which components are deposited in layers, have those disposed at an upper stage and those disposed at a lower stage. That is, in power module 301, the plurality of first mixture regions 3 have some thereof (i.e., those at the lower stage in FIG. 20(A)) disposed in contact with first soldering portion 4S and insulating substrate 1 and spaced from semiconductor chip 5, and the others thereof (i.e., those at the upper stage in FIG. 20(A)) disposed in contact with first soldering portion 4S and semiconductor chip 5 and spaced from insulating substrate 1. The lower stage has first mixture regions 3 each disposed only in a region overlapping one of four corners of first soldering portion 4S and the upper stage has first mixture regions 3 each disposed at a midpoint of one of four sides of a rectangle formed by connecting the corners. The plurality of these first mixture regions 3 are each (e.g., entirely) buried in first soldering portion 4S.

By analyzing a finished product of power module 101, it can be verified that first mixture region 3 and second mixture region 7 are disposed in contact with first soldering portion 4S and second soldering portion 8S, respectively, generally as shown in FIG. 6.

Hereinafter, a function and effect of the present embodiment will be described. In addition to the same effect as the first embodiment, the present embodiment has a function and effect as follows:

In the first embodiment, by disposing first provisional fixing portion 3 with at least a portion thereof located in a region outside an end face of semiconductor chip 5, a finished product of power module 101 has a plurality of first mixture regions 3 each in contact with both insulating substrate 1 and semiconductor chip 5. However, disposing first provisional fixing portion 3 with at least a portion thereof located in the region outside the end face of semiconductor chip 5, as done in the first embodiment, may not allow first mixture region 3 to be brought into contact with both insulating substrate 1 and semiconductor chip 5. That is, even if first provisional fixing portion 3 is disposed as shown in FIG. 1, a final product after the reflow process does not necessarily take a form with first mixture region 3 in contact with first soldering portion 4S and also in contact with both insulating substrate 1 and semiconductor chip 5. If first provisional fixing portion 3 cannot be brought into contact with both insulating substrate 1 and semiconductor chip 5, first provisional fixing portion 3 may no longer provisionally fix semiconductor chip 5 effectively.

Accordingly, as in the present embodiment, first provisional fixing portion 3 is disposed to overlie and underlie and thus sandwich first solder layer 4. This allows a portion of first provisional fixing portion 3 to adhere to insulating substrate 1 and another portion of first provisional fixing portion 3 to adhere to semiconductor chip 5 more reliably than the first embodiment. As these first provisional fixing portions 3 all adhere to first solder layer 4, these ensure that insulating substrate 1, first provisional fixing portion 3, first solder layer 4 and semiconductor chip 5 are provisionally fixed together.

As a reliable, provisional fixing effect can thus be obtained, the present embodiment does not require one first provisional fixing portion 3 to be in contact with both insulating substrate 1 and semiconductor chip 5, as in the first embodiment. Rather, from the viewpoint of minimizing a footprint in a plan view, in the present embodiment, it is preferable that in the present embodiment first provisional fixing portion 3 be entirely disposed inwardly of an end face of first solder layer 4 in a plan view so that first provisional fixing portion 3 entirely, completely overlaps first solder layer 4.

Furthermore, although the present embodiment has an increased number of first provisional fixing portions 3, they are also disposed such that they are mutually spaced and thus dispersed, and accordingly, as well as the first embodiment, the present embodiment can also reduce a possibility of void remaining in first and second soldering portions 4S and 8S.

Fourth Embodiment

In the third embodiment, not only are first provisional fixing portions 3 disposed at positions overlapping the four corners of first solder layer 4 in a plane, but a further larger number of first provisional fixing portions 3 are also disposed in the upper stage of first solder layer 4, in particular. When providing a larger number of first provisional fixing portions 3 than in the first embodiment is compared with only disposing first provisional fixing portions 3 at positions overlapping the four corners of first solder layer 4 in a plane, as done in the first embodiment, the former can more reliably, provisionally fix semiconductor chip 5 with respect to insulating substrate 1 at a desired position than the latter. Thus, with first provisional fixing portion 3 or the like suppressing positional displacement between members while they are handled and conveyed before the reflow process, power module 101 can be provided more reliably with higher productivity through a reflow process performed only once.

Figure 21A:
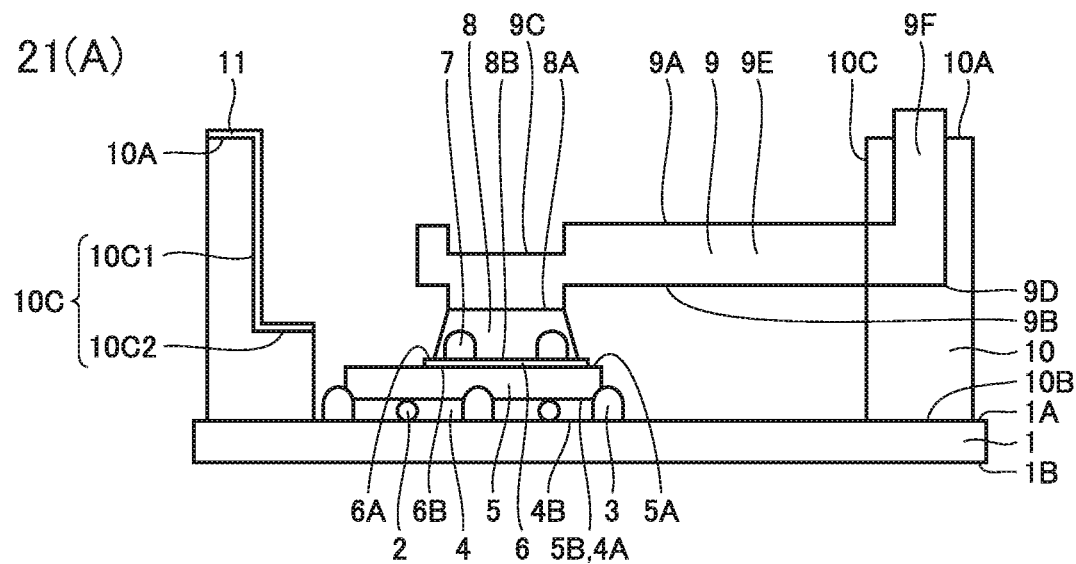
FIG. 21(A) is a schematic side view and FIG. 21(B) is a schematic plan view showing a configuration of a power module according to a first example of a fourth embodiment of the present invention.
Figure 21B:
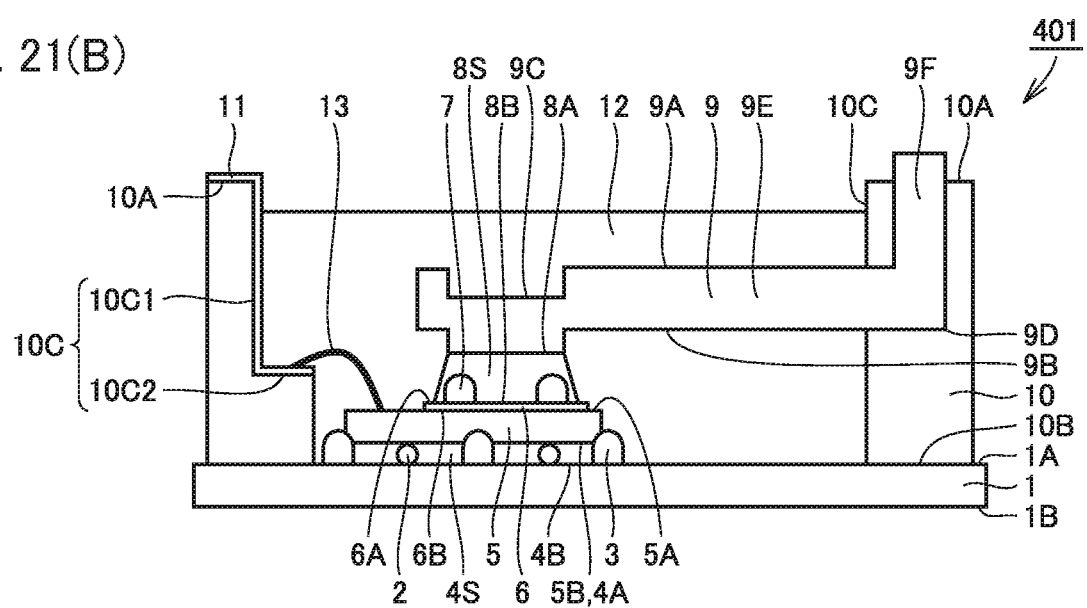
Figure 22A:
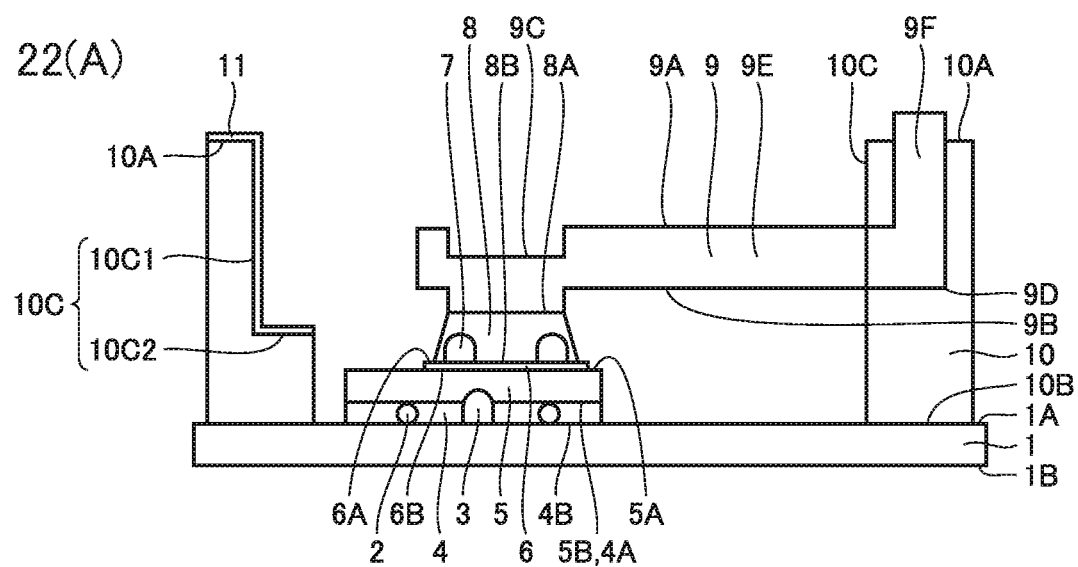
FIG. 22(A) is a schematic side view and FIG. 22(B) is a schematic plan view showing a configuration of a power module according to a second example of the fourth embodiment of the present invention.
Figure 22B:
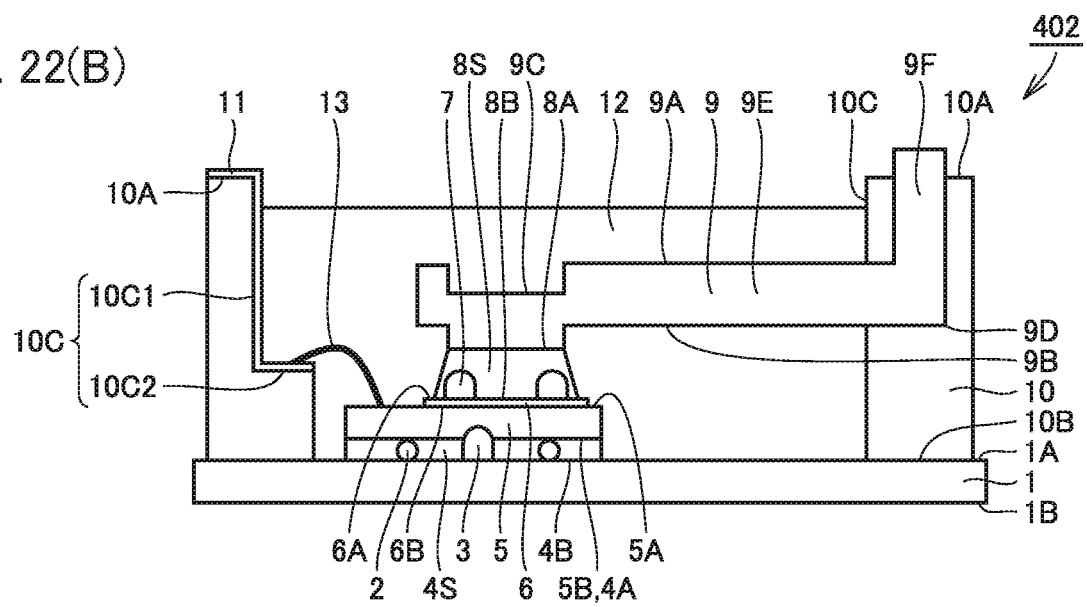

Note that disposing first provisional fixing portions 3 at positions overlapping the four corners of first solder layer 4 in a plane and a position overlapping a midpoint of each of four sides formed by connecting the positions is not limited to the example of disposing first provisional fixing portions 3 to overlie and underlie first solder layer 4 as done in the third embodiment, and may be applied to first provisional fixing portions 3 of only a single layer similar to the first embodiment, as shown in FIGS. 21(A) and 21(B) showing a power module 401. This case, as well as the third embodiment, also provides a larger number of first provisional fixing portions 3 than the first embodiment does, so that when this case is compared with the first embodiment, that is, only disposing first provisional fixing portions 3 at positions overlapping the four corners of first solder layer 4 in a plane, the former can more reliably, provisionally fix semiconductor chip 5 with respect to insulating substrate 1 at a desired position than the latter. Conversely, insofar as reliable provisional fixation can be done, then, as shown in FIGS. 22(A) and 22(B) showing a power module 402, first provisional fixing portions 3 of a single stage may be disposed each only at a midpoint of one of four sides formed by connecting positions overlapping the four corners of first solder layer 4 in a plane.

That is, insofar as a provisional fixation effect is obtained, first provisional fixing portions 3 are not limited in number to four or eight and may be more or less than that, and can also be disposed at an end portion of first solder layer 4 or any location adjacent thereto.

While in each of the above embodiments first solder layer 4 and second solder layer 8 used are those processed into a plate, they are not limited as such and for example solder processed into a linear form may be used.

Fifth Embodiment

The first to fourth embodiments all provide a manufacturing process with a silver-containing pasty member serving as first provisional fixing portion 3 and second provisional fixing portion 7. Alternatively, first provisional fixing portion 3 and second provisional fixing portion 7 may include therein a material which volatilizes at a temperature lower than solder's melting point, and a sinterable metal material.

However, if the material is a liquid material, its surface tension can provisionally fix each member. Accordingly, in the present embodiment, the manufacturing process is performed with first provisional fixing portion 3 and second provisional fixing portion 7 made of a material which volatilizes at a temperature lower than the solder's melting point in the reflow process. Herein, first provisional fixing portion 3 and second provisional fixing portion 7 being made of a volatile material means that first provisional fixing portion 3 and second provisional fixing portion 7 do not contain a metal material such as silver and are made only of a volatile material. Specifically, first provisional fixing portion 3 and second provisional fixing portion 7 in the present embodiment are composed only of a liquid material such as flux.

Flux volatilizes at a temperature lower than the melting point of the solder. For this reason, the flux is completely removed if in the reflow process a sufficient preheating time is provided at a temperature below a temperature at which the solder of first solder layer 4 and second solder layer 8 melts. In the present embodiment, it is preferable to use a reducing flux as first provisional fixing portion 3 and second provisional fixing portion 7, in particular. This can enhance bondability for semiconductor chip 5 and conductive member 9 fixed thereby.

In the present embodiment, the flux as first provisional fixing portion 3 or the like is completely removed. Therefore, for example, in contrast to power module 101 of FIG. 6A, a finished product does not have first mixture region 3 or the like bonded to the same layer as first soldering portion 4S so as to have a composition different from that of first soldering portion 4S. That is, there is provided a configuration shown in FIG. 6(A) or the like having first mixture region 3 and second mixture region 7 removed therefrom and first soldering portion 4S and second soldering portion 8S bonding each member.

First provisional fixing portion 3 and second provisional fixing portion 7 are only disposed in a partial region such as corners of first solder layer 4 and second solder layer 8 in a plan view. Therefore, there is little possibility that after first provisional fixing portion 3 and second provisional fixing portion 7 are volatilized and removed the removed and hollowed portion is trapped in first soldering portion 4S and second soldering portion 8S and thus becomes void.

First provisional fixing portion 3 and second provisional fixing portion 7 in the present embodiment may be any liquid material that volatilizes at a temperature lower than the melting point of the solder in the reflow process. Accordingly, first provisional fixing portion 3 and second provisional fixing portion 7 are not limited to a flux and may be water or ethanol.

Sixth Embodiment

Figure 23:
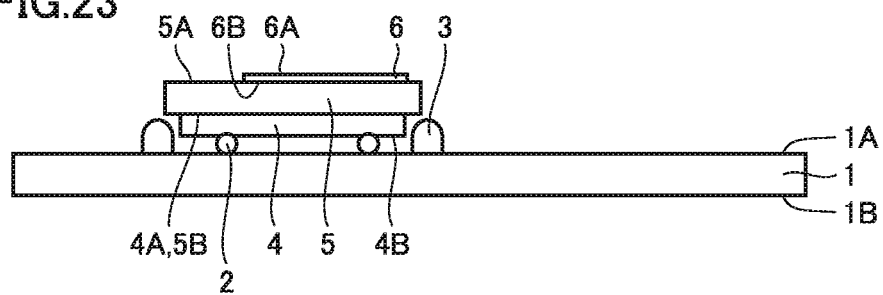
FIG. 23 is a schematic side view showing a second step, i.e., a step corresponding to FIG. 2, of a method for manufacturing a power module in a sixth embodiment of the present invention.
Figure 24:
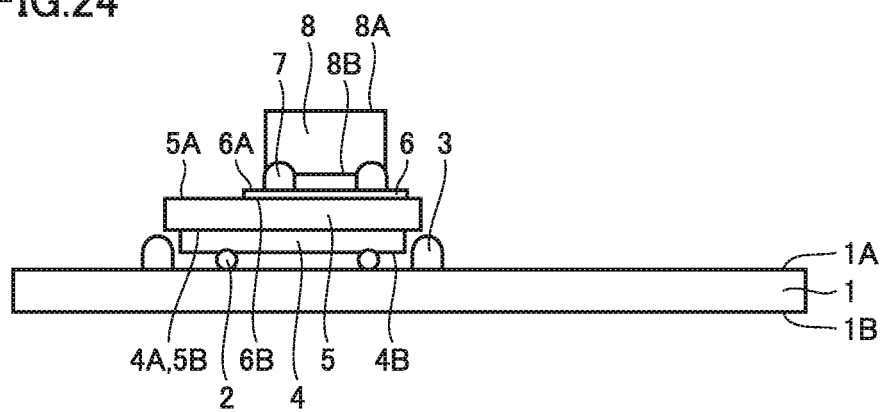
FIG. 24 is a schematic side view showing a third step, i.e., a step corresponding to FIG. 3, of the method for manufacturing a power module in the sixth embodiment of the present invention.

The steps shown in FIGS. 23 and 24 correspond to the steps shown in FIGS. 2 and 3 according to the first embodiment. Referring to FIGS. 23 and 24, the present embodiment, as well as the first embodiment, also employs first provisional fixing portion 3 and second provisional fixing portion 7 such as a pasty member containing silver. Note, however, that in FIGS. 23 and 24, first solder layer 4 is slightly smaller in a plan view than semiconductor chip 5. Specifically, for example, if semiconductor chip 5 in a plan view has a size of 15 mm long and 15 mm wide, first solder layer 4 in a plan view has a size of 14 mm long and 14 mm wide. In the first embodiment, basically, it is assumed that first solder layer 4 has substantially the same size as semiconductor chip 5 in a plan view. The present embodiment is different from the first embodiment only in this point.

Even if a setting is done as in the present embodiment, first soldering portion 4S similar to that of the first embodiment can finally be obtained by supplying solder in a larger amount than in the first embodiment, such as making first solder layer 4 slightly thicker than in the first embodiment for example. This is because the solder wets and spreads after it is melted.

Further, according to the present embodiment, after the solder of first solder layer 4 is melted, even if a volatile component is generated from first provisional fixing portion 3, the volatile component is taken into the solder. This can suppress generation of void due to the volatile component from first provisional fixing portion 3.

Seventh Embodiment

The present embodiment is an application of a semiconductor device according to the first to sixth embodiments to a power conversion device. Although the present invention is not limited to a certain power conversion device, a case with the present invention applied to a three-phase inverter will be described below as a seventh embodiment.

Figure 25:
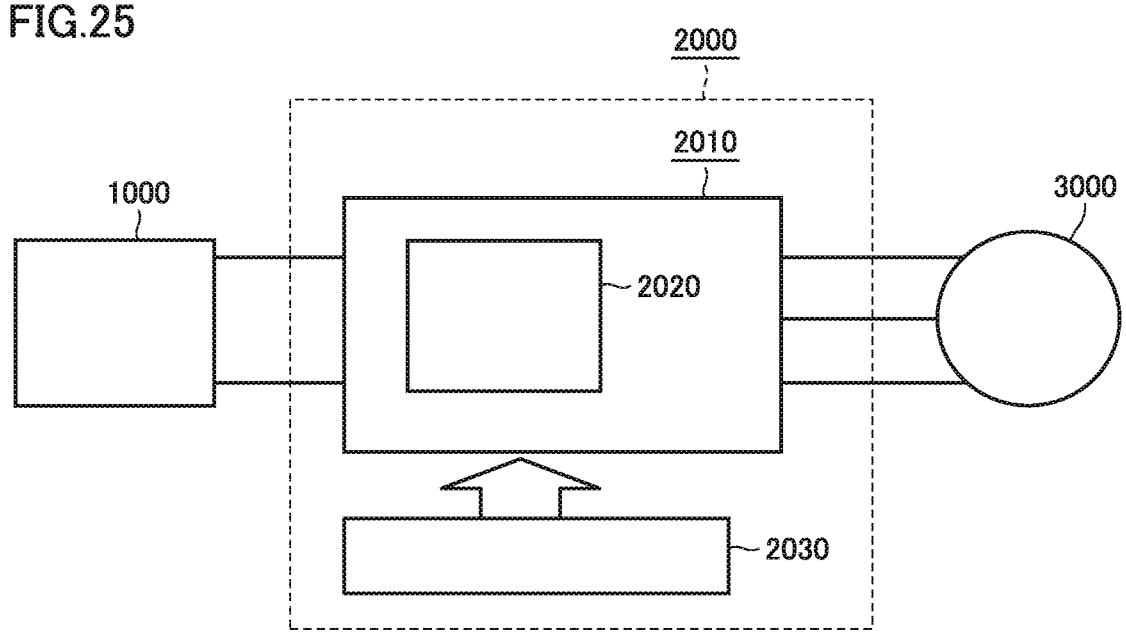
FIG. 25 is a block diagram showing a configuration of a power conversion system to which a power conversion device according to a fifth embodiment of the present invention is applied.

FIG. 25 is a block diagram showing a configuration of a power conversion system to which a power conversion device according to the present embodiment is applied. FIG. 25 shows the power conversion system composed of a power supply 1000, a power conversion device 2000, and a load 3000. Power supply 1000 is a DC power supply, and supplies DC power to power conversion device 2000. Power supply 1000 can be configured by various types, and can be configured by, for example, a DC system, a solar cell, or a storage battery, or may be configured by a rectifier circuit or an AC/DC converter connected to an AC system. Further, power supply 1000 may be configured by a DC/DC converter which receives DC power output from a DC system and converts it to another DC power.

Power conversion device 2000 is a three-phase inverter connected between power supply 1000 and load 3000, and receives DC power from power supply 1000, converts the received DC power to AC power, and supplies the AC power to load 3000. Power conversion device 2000, as shown in FIG. 6, comprises a main conversion circuit 2010 that converts received DC power to AC power and outputs it and a control circuit 2030 that outputs a control signal to main conversion circuit 2010 to control main conversion circuit 2010.

Load 3000 is a three-phase motor driven by AC power supplied from power conversion device 2000. Load 3000 is not limited to a particular application, and it is a motor mounted in various electric devices and is used as a motor for example for a hybrid vehicle, an electric vehicle, a railway vehicle, an elevator, or an air conditioner.

Hereinafter, power conversion device 2000 will more specifically be described. Main conversion circuit 2010 includes a switching device and a freewheeling diode (not shown), and when the switching device switches, main conversion circuit 2010 converts DC power received from power supply 1000 to AC power and supplies the AC power to load 3000. While main conversion circuit 2010 has a variety of types of specific circuit configurations, main conversion circuit 2010 according to the present embodiment is a two-level three-phase full bridge circuit and can be composed of six switching devices and six freewheeling diodes connected to their respective switching devices in anti-parallel. At least any one of each switching device and each freewheeling diode of main conversion circuit 2010 is constituted by semiconductor module 2020 corresponding to power modules 101, 201, 202 and 301 of any of the first to sixth embodiments described above. The six switching devices have every two switching devices connected in series to constitute upper and lower arms, and each upper and lower arm constitutes each phase (U phase, V phase, and W phase) of the full bridge circuit. The upper and lower arms have their output terminals, i.e., main conversion circuit 2010 has three output terminals, connected to load 3000.

Further, main conversion circuit 2010 includes a drive circuit (not shown) for driving at least one of each switching device and each freewheeling diode (hereinafter also referred to as "(each) switching device"). However, the drive circuit may be incorporated in semiconductor module 2020, or the drive circuit may be comprised separately from semiconductor module 2020. The drive circuit generates a drive signal for driving the switching devices of main conversion circuit 2010 and supplies it to a control electrode of each switching device of main conversion circuit 2010. Specifically, in response to a control signal received from control circuit 2030, which will be described hereinafter, the drive circuit outputs to the control electrode of each switching device a drive signal for turning on the switching device and a drive signal for turning off the switching device. When the switching device is held on, the drive signal is a voltage signal higher than a threshold voltage for the switching device (an ON signal), whereas when the switching device is held off, the drive signal is a voltage signal lower than the threshold voltage for the switching device (an OFF signal).

Control circuit 2030 controls the switching devices of main conversion circuit 2010 to allow load 3000 to receive power as desired. Specifically, based on the power to be supplied to load 3000, a time for which main conversion circuit 2010 should have each switching device turned on (i.e., an on-time) is calculated. For example, main conversion circuit 2010 can be controlled by PWM control that modulates the on time for each switching device according to the voltage to be output. Then, a control command (or a control signal) is output to the drive circuit that main conversion circuit 2010 comprises so that at each point in time the on signal is output to a switching device to be turned on and the off signal is output to a switching device to be turned off. In response to this control signal, the drive circuit outputs the on signal or the off signal as a drive signal to the control electrode of each switching device.

The power conversion device according to the present embodiment that comprises main conversion circuit 2010 including switching devices and freewheeling diodes with a power module according to the first to sixth embodiments applied thereto can suppress positional displacement between members and provide enhanced thermal radiation.

While in the present embodiment an example in which the present invention is applied to a two-level three-phase inverter has been described, the present invention is not limited thereto and is applicable to various power conversion devices. While the present embodiment is a two-level power conversion device, it may be a three-level or multilevel power conversion device and when a single-phase load is supplied with power the present invention may be applied to a single-phase inverter. Further, when a DC load or the like is supplied with power, the present invention is also applicable to a DC/DC converter, an AC/DC converter or the like.

Further, the power conversion device with the present invention applied thereto is not limited to a case where a load is a motor, as described above, and, for example, it can also be used as a power supply device for an electric spark machine or a laser processing machine, or an induction heating cooker or a contactless power feeding system, and furthermore, it can also be used as a power conditioner for a solar power generation system and a power storage system.

The features described in (the examples included in) the embodiments described above may be applied in an appropriate combination within a technologically consistent range.

It should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST 1 insulating substrate, 1A, 4A, 5A, 6A, 8A, 9A, 10A front surface, 1B, 4B, 5B, 6B, 8B, 9B, 10B back surface, 2 wire bump, 3 first provisional fixing portion (first mixture region), 4 first solder layer, 4S first soldering portion, 5 semiconductor chip, 6 top electrode, 7 second provisional fixing portion (second mixture region), 8 second solder layer, 8S second soldering portion, 9 conductive member, 9C recess of conductive member, 9D bent portion, 9E, 9G horizontally extending portion, 9F vertically extending portion, 10 case, 10C inner side surface of case, 10C1, 10C2 inner side surface, 11 connection terminal, 12 sealing resin, 13 bonding wire, 14, 15 pressing jig, 16 pad, 17 guard ring, 101, 102, 301, 401, 402 power module, 1000 power supply, 2000 power conversion device, 2010 main conversion circuit, 2030 control circuit, 3000 load.

The invention claimed is:

1. A method for manufacturing a semiconductor device, comprising:
    supplying a plurality of first provisional fixing portions on a front surface of a substrate such that the plurality of first provisional fixing portions are spaced from each other and thus dispersed;
    disposing in contact with the plurality of first provisional fixing portions a first solder layer processed in a form of a single, rectangular, plate-shaped material;
    disposing a semiconductor chip on the first solder layer;
    disposing a plurality of second provisional fixing portions on a front surface of the semiconductor chip such that the plurality of second provisional fixing portions are spaced from each other and thus dispersed;
    disposing in contact with the plurality of second provisional fixing portions a second solder layer processed in a form of a single, rectangular, plate-shaped material;
    disposing on the second solder layer a conductive member in a form of a flat plate; and
    heating the substrate, the semiconductor chip and the conductive member to bond the substrate and the semiconductor chip by the first solder layer and bond the semiconductor chip and the conductive member by the second solder layer.

2. The method for manufacturing the semiconductor device according to claim 1, further comprising, after the step of disposing the second solder layer before the step of disposing the conductive member, pressing a stack of the first and second solder layers and the semiconductor chip toward the substrate.

3. The method for manufacturing the semiconductor device according to claim 1, further comprising, after the step of disposing the first solder layer before the step of disposing the semiconductor chip, additionally supplying the plurality of first provisional fixing portions on a front surface of the first solder layer such that the plurality of first provisional fixing portions are spaced from each other and thus dispersed.

4. The method for manufacturing the semiconductor device according to claim 1, wherein the first and second provisional fixing portions include a material set at a temperature lower than solder's melting point in a reflow process.

5. The method for manufacturing the semiconductor device according to claim 1, wherein in the steps of supplying the first and second provisional fixing portions, the first and second provisional fixing portions are an adhesive having viscosity in a temperature range from room temperature to solder's melting point.

6. The method for manufacturing the semiconductor device according to claim 1, wherein the first and second provisional fixing portions include a material volatilizing at a temperature lower than solder's melting point in a reflow process.

7. The method for manufacturing the semiconductor device according to claim 6, wherein the first and second provisional fixing portions include a sinterable metal material sintered at a temperature lower than the solder's melting point in the reflow process.

8. The method for manufacturing the semiconductor device according to claim 1, wherein the first and second provisional fixing portions are formed of a material volatilizing at a temperature lower than solder's melting point in a reflow process.

9. The method for manufacturing the semiconductor device according to claim 8, wherein the material that volatilizes at a temperature lower than the solder's melting point in the reflow process is a flux.

10. A semiconductor device comprising:
    a substrate;
    a semiconductor chip disposed on the substrate;
    a conductive member in a form of a flat plate disposed on the semiconductor chip,
    the substrate and the semiconductor chip being bonded together by a first soldering portion in a form of a single, rectangular, plate-shaped material,
    the semiconductor chip and the conductive member being bonded together by a second soldering portion in a form of a single, rectangular, plate-shaped material;
    a plurality of first regions disposed in a same layer as the first soldering portion such that the plurality of first regions are spaced from each other, and having a composition different than the first soldering portion; and
    a plurality of second regions disposed in a same layer as the second soldering portion such that the plurality of second regions are spaced from each other, and having a composition different than the second soldering portion.

11. The semiconductor device according to claim 10, wherein the first and second regions are set at a temperature lower than solder's melting point.

12. The semiconductor device according to claim 10, wherein the first and second regions include silver.

13. The semiconductor device according to claim 10, wherein
    the first and second soldering portions have a rectangular shape, and
    the plurality of first regions are disposed to overlap four corners of the first soldering portion in a plan view and
    the plurality of second regions are disposed to overlap four corners of the second soldering portion in a plan view.

14. The semiconductor device according to claim 10, wherein the plurality of first regions are in contact with both the substrate and the semiconductor chip.

15. The semiconductor device according to claim 10, wherein
    the plurality of first regions have some thereof disposed in contact with the first soldering portion and the substrate and spaced from the semiconductor chip, and
    the plurality of first regions have some other thereof disposed in contact with the first soldering portion and the semiconductor chip and spaced from the substrate.

16. A power conversion circuit comprising:
    a main conversion circuit having a semiconductor device according to claim 10 and configured to convert received power and output converted power; and a control circuit configured to output a control signal to the main conversion circuit to control the main conversion circuit.

\* \* \* \* \*